（12） United States Patent
Haran et al.

(10) Patent No.: US 12,506,075 B2
(45) Date of Patent: Dec. 23, 2025

(54) EPITAXIAL SOURCE/DRAIN BACK-SIDE DEVICE CONTACT STRUCTURES WITH WRAP AROUND METALLIZATION AND PROTECTIVE CONFORMAL LINER

(71) Applicant: Intel Corporation, Santa Clara, CA (US)

(72) Inventors: Mohit Haran, Hillsboro, OR (US); Charles Wallace, Portland, OR (US); Leanord Guler, Hillsboro, OR (US); Sukru Yemenicioglu, Portland, OR (US); Mauro Kobrinsky, Portland, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1035 days.

(21) Appl. No.: 17/358,442

(22) Filed: Jun. 25, 2021

(65) Prior Publication Data

US 2022/0415795 A1 Dec. 29, 2022

(51) Int. Cl.
*H01L 23/528* (2006.01)
*H01L 21/02* (2006.01)
(Continued)

(52) U.S. Cl.
CPC ...... *H01L 23/5286* (2013.01); *H01L 21/0259* (2013.01); *H10D 30/031* (2025.01);
(Continued)

(58) Field of Classification Search
CPC .............. H01L 23/5286; H01L 21/0259; H01L 29/0665; H01L 29/401; H01L 29/41733; H01L 29/42392; H01L 29/66742; H01L 29/78618; H01L 29/78696; H01L 29/41725; H01L 29/66439; H01L 21/823475; H01L 29/0673; H01L 29/0847; H01L 29/775; H01L 21/76897;
(Continued)

(56) References Cited

U.S. PATENT DOCUMENTS 9,466,723 B1 10/2016 Huang et al.
2006/0219565 A1\* 10/2006 Preusse .................. C25D 17/10
257/E21.585

(Continued)

OTHER PUBLICATIONS

Murarka, S. P. "Properties and applications of silicides." Microelectronic Materials and Processes. Dordrecht: Springer Netherlands, 1989. 275-323. (Year: 1989).\*
Extended European Search Report from European Patent Application No. 22166446.9 notified Oct. 19, 2022, 10 pgs.
Notice of Allowance from European Patent Application No. 22166446.9 notified Apr. 9, 2025, 7 pgs.

*Primary Examiner* — Lex H Malsawma
*Assistant Examiner* — Ethan Edward Cutler
(74) *Attorney, Agent, or Firm* — Essential Patents Group, LLP

(57) ABSTRACT

Back-side transistor contacts that wrap around a portion of source and/or drain semiconductor bodies, related transistor structures, integrated circuits, systems, and methods of fabrication are disclosed. Such back-side transistor contacts are coupled to a top and a side of the source and/or drain semiconductor and extend to back-side interconnects. Coupling to top and side surfaces of the source and/or drain semiconductor reduces contact resistance and extending the metallization along the side reduces transistor cell size for improve device density.

19 Claims, 15 Drawing Sheets

(51) Int. Cl.
*H10D 30/01* (2025.01)
*H10D 30/67* (2025.01)
*H10D 62/10* (2025.01)
*H10D 64/01* (2025.01)

(52) U.S. Cl.
CPC ..... *H10D 30/6713* (2025.01); *H10D 30/6729* (2025.01); *H10D 30/6735* (2025.01); *H10D 30/6757* (2025.01); *H10D 62/118* (2025.01); *H10D 64/01* (2025.01)

(58) Field of Classification Search
CPC ............. H01L 23/482; H01L 21/76895; H01L 23/4824; H01L 23/4825; H01L 23/4827; H01L 27/0886; B82Y 10/00
See application file for complete search history.

(56) References Cited

U.S. PATENT DOCUMENTS

| | | | |
|---|---|---|---|
| 2015/0137061 A1* | 5/2015 | Donghi | H10B 63/80 257/4 |
| 2020/0098681 A1 | 3/2020 | Kim et al. | |
| 2020/0135724 A1* | 4/2020 | Lin | H01L 23/485 |
| 2020/0411430 A1* | 12/2020 | Mannebach | H10D 62/121 |
| 2021/0098338 A1* | 4/2021 | Liaw | H01L 21/76877 |
| 2021/0098584 A1* | 4/2021 | Cheng | H10D 62/151 |

* cited by examiner

EPITAXIAL SOURCE/DRAIN BACK-SIDE DEVICE CONTACT STRUCTURES WITH WRAP AROUND METALLIZATION AND PROTECTIVE CONFORMAL LINER

BACKGROUND

Transistor cell density is an important characteristic in integrated circuits as increased cell density improves device capability. As cell density increases and transistor area decreases, scaling interconnects becomes increasingly difficult particularly with respect to achieving low resistance and necessary power delivery. Notably, back-side device contacts may be employed to provide such interconnects. For example, deep trench-like interconnects may be employed to provide power from the back-side of devices. However, such metal connections to distribute power from the back-side to the front-side of the transistor devices utilize significant cell area, which limits area scaling. Furthermore, current power connections may be shared by many devices, which creates resistance crowding effects. For example, when multiple nearby devices connected to a single power source draw power, undesirable voltage drops may occur. Also, capacitance penalties are significant with power rails at cell edges in close proximity to gate ends and/or active device areas.

It is desirable to provide source and drain contacts to transistor devices that offer increasing transistor cell density with optional contacts to each device source or drain for improved device performance. It is with respect to these and other considerations that the present improvements have been needed. Such improvements may become critical to increase cell density in higher performance integrated circuit electronic devices.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
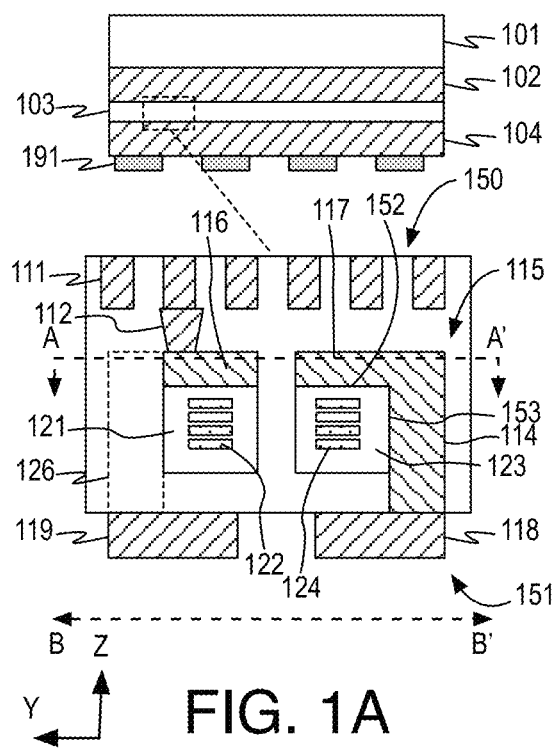
FIGS. 1A, 1B, 1C, and 1D provide views of components of an exemplary transistor structure having wrap around source and/or drain metallization contacts to back-side metal.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direction contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Transistor structures, device structures, apparatuses, integrated circuits, computing platforms, and methods are described herein related to metallization contacts to source or drain structures such that the metallization contacts a top surface of the source or drain structures, extends along a side surface of the source or drain structures, and contacts a back-side metal of the device. Such metallization contacts improve density, reduce contact resistance, and offer other advantages as discussed herein.

In some embodiments, a transistor structure includes a channel semiconductor between a source semiconductor and a drain semiconductor. The transistor structure has a front-side and a back-side with the front-side defined by a build up direction as well as being distal to a substrate on which the transistor structure is fabricated. The back-side is opposite the front-side. Notably, the transistor structure is typically contacted from the front-side during build up. The source and drain semiconductors may be epitaxial bodies including silicon and germanium (SiGe) such as epitaxial SiGe that is highly doped. One or both of the source semiconductor and drain semiconductor are contacted by a contact metallization that contacts a top surface of the source and/or drain semiconductor such that the top surface is proximal to the front-side of the transistor structure. The contact metallization further contacts a side surface of the source and/or drain semiconductor such that the contact metallization may be characterized as a direct metal wrap around connection to the source and/or drain semiconductor. The contact metallization extends beyond a bottom surface of the source and/or drain semiconductor to a back-side metal of the transistor structure. The term back-side metal indicates one or more metallization layers (e.g., metal lines interconnected by metal vias) over the back-side of the transistor structure. Such back-side metal may also be characterized as back-side interconnects or back-side interconnect layers. Similarly, a front-side metal indicates one or more metallization layers (e.g., metal lines interconnected by metal vias) over the front-side of the transistor structure and the front-side metal may be characterized as front-side interconnects, front-side interconnect layers, or the like. Thereby, a direct metal wrap around connection from back-side interconnect layers to a front-side of the source and/or drain semiconductor is provided. The front-side contact to the source and/or drain semiconductor may be characterized as a trench contact as the front-side contact is typically in a trench that extends perpendicular to the source-channel-drain direction of the transistor structure.

The techniques and transistor structures discussed herein may be employed to contact every or some device sources while enabling transistor cell scaling. Such increased scaling is enabled by creating a metal connection that wraps around the epitaxial source semiconductor, for example, to interconnect the front and back-side metal layers. Such connection minimizes cell area impacts. In some embodiments, the drain semiconductor is contacted only by the front-side metal layers while the source semiconductor is contacted only by the back-side metal layers using the discussed wrap around metallization contact. However, any combination of front-side and back-side connections to the source and drain semiconductors or the metallization contacts to the source and drain semiconductors may be employed.

Figure 1B:
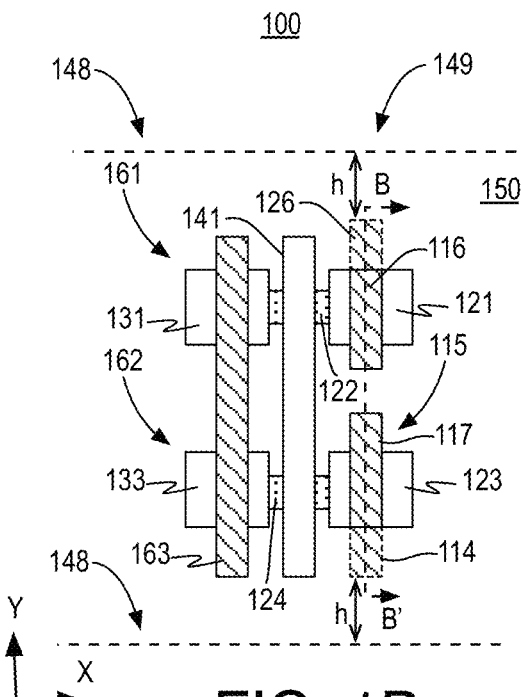

FIGS. 1A, 1B, 1C, and 1D provide views of components of an exemplary transistor structure 100 having wrap around source and/or drain metallization contacts to back-side metal, arranged in accordance with at least some implementations of the present disclosure. FIG. 1A illustrates a cross-sectional view of transistor structure 100 taken along a source and/or drain cut. FIG. 1B shows a top-down view of transistor structure 100 having some components removed for the sake of clarity of presentation. Notably, the source and/or drain cut shown in FIG. 1A is along the B-B' line in FIG. 1B. Furthermore, the cross-sectional view of transistor structure 100 in FIG. 1A is a magnified view of a portion of transistor structure 100. As shown, transistor structure 100 includes a transistor layer 103, a front-side metal interconnect layer 102, and a back-side metal interconnect layer 104. In the illustrated example, transistor structure 100 includes a carrier substrate 101, which may later be removed. As shown, power delivery for transistor structure 100 may be provided from a back side 151 via external interconnects 191, which may be bump interconnects or any other suitable interconnects to transistor structure 100.

In the illustrated example, transistor structure 100 includes a transistor 161 and a transistor 162 that have a shared drain contact 163 and a shared gate structure 141 with selective source contacts such that a source contact 116 is provided to transistor 161 and a source contact 115 is provided to transistor 162. Transistor 161 includes channel semiconductors 122 (e.g., nanoribbons) and transistor 162 includes channel semiconductors 124 (e.g., nanoribbons). Furthermore, transistor 161 includes a source 121 (e.g., a source semiconductor) and a drain 131 (e.g., a drain semiconductor) and transistor 162 includes a source 123 (e.g., a source semiconductor) and a drain 133 (e.g., a drain semiconductor). The source and drain semiconductors may be epitaxial bodies such as epitaxial silicon and germanium (SiGe), for example. In the illustrated example, channel semiconductors 122, 124 are at least partially embedded in sources 121, 123 and drains 131, 133. In some embodiments, channel semiconductors 122, 124 abut sources 121, 123 and drains 131, 133 and do not extend into sources 121, 123 and drains 131, 133.

As shown, source contact 115 has a portion 117 on (e.g., in contact with) a top surface 152 and a portion 114 that is on a side surface 153 of source 123 and extends to a back-side 151 metal interconnect 118. Portion 114 may be characterized as a deep via or deep contact and portion 117 may be characterized as a trench contact. Furthermore, source contact 116 is illustrated with only a trench contact but a deep contact portion 126 may be employed in some embodiments to contact source 121 to a back-side 151 metal interconnect 119. Absent deep contact portion 126, as shown, source 121 may be contacted by a metal contact 112 to a metal line 111 such that metal contact 112 and metal line 111 are a portion of front-side metal interconnect layer 102. Notably, a metal contact in analogy to metal contact 112 may be used to couple drain contact 163 to front-side metal interconnect layer 102. Furthermore, although illustrated with respect to source contacts, wrap around contact 115 may be employed for drain contacts in addition to or in the alternative to source contact applications.

As shown in FIG. 1B, a transistor cell 149, or portion thereof, inclusive of transistors 161, 162 has a reduced footprint relative to transistor cells employing other back-side contacts. For example, due to wrap around metallization contacts including source contact 115, back side trench contacts are not needed at cell boundaries 148. Therefore, transistor cell 149 may be reduced in size (in the y-dimension) by 2 h, with h being the distance between the unneeded trench contact and the width (e.g., in the y-dimension) of portion 114 of source contact 115. Thereby, reduced transistor cell 149 size is provided and increased transistor density may be achieved while necessary power delivery is achieved from back-side 151.

Figure 1C:
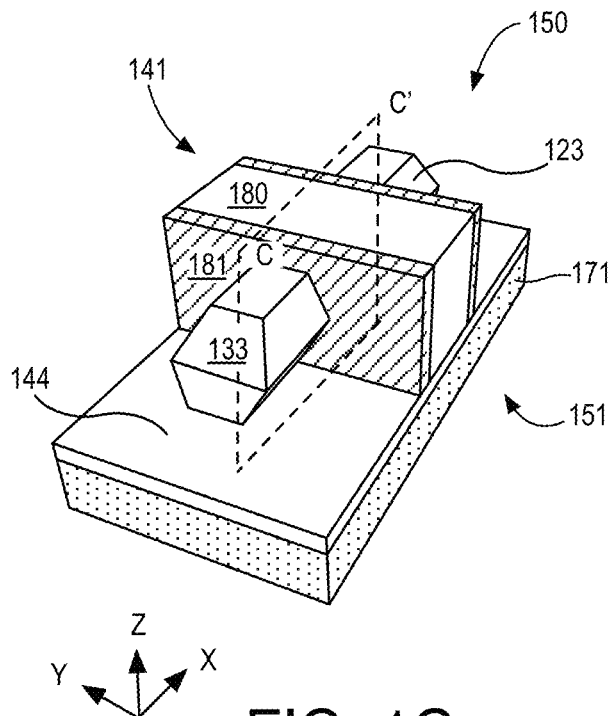
Figure 1D:
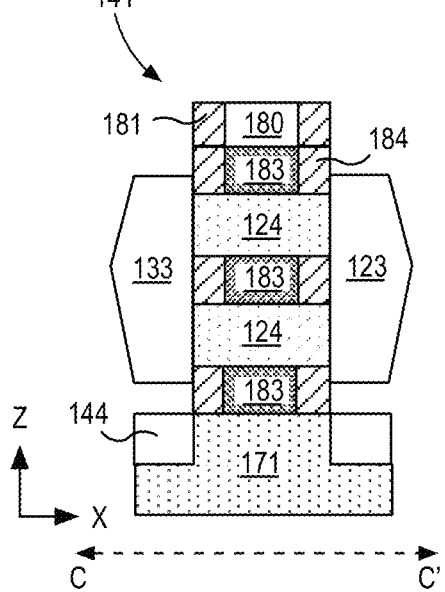

Turning to FIGS. 1C and 1D, FIG. 1C provides an isometric view of selected components of transistor 161. As shown, transistor 161, inclusive of source 123, drain 133, and gate structure 141, is illustrated as formed over a substrate 171 and partially within a dielectric material 144 for the sake of illustrate. As shown, gate structure 141 may include sidewall spacers 181 and a gate contact including a material 180 such as polysilicon. As shown in the cross-section of FIG. 1D, gate structure 141 may further include sidewall spacer material 184 and wrap around gate contacts 183 that may include a gate dielectric layer immediately adjacent channel semiconductors 124 (e.g., wrapping around channel semiconductors 124) and a gate electrode on the gate dielectric layer.

FIGS. 1C and 1D illustrate components of transistor 161 for the sake of clarity of presentation. As discussed further herein, one or both of source 123 and drain 133 may be contacted by a contact metallization that contacts a top surface thereof (e.g., proximal to front-side 150) and a side surface thereof, and extends to a back side metal interconnect proximal to back-side 151.

Figure 2:
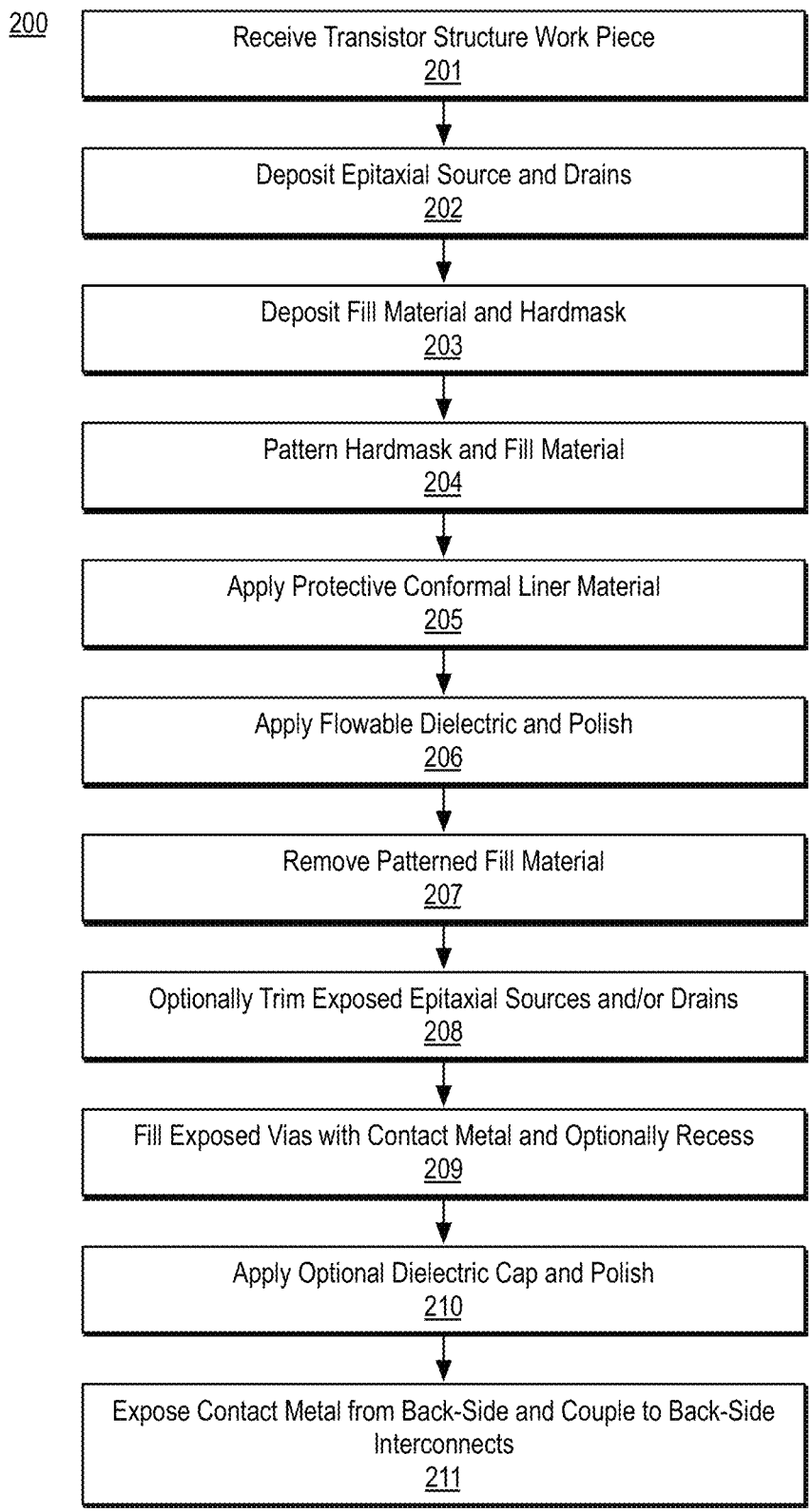
FIG. 2 illustrates a flow diagram illustrating an example process for fabricating transistor structures having deep via wrap around metallization contacts for source and/or drain regions.

FIG. 2 illustrates a flow diagram illustrating an example process 200 for fabricating transistor structures having deep via wrap around metallization contacts for source and/or drain regions, arranged in accordance with at least some implementations of the present disclosure. For example, process 200 may be implemented to fabricate transistor structure 100 or any other transistor structure discussed herein. In the illustrated embodiment, process 200 includes one or more operations as illustrated by operations 201-211. However, embodiments herein may include additional operations, certain operations being omitted, or operations being performed out of the order provided. In various embodiments, process 200 may fabricate transistor structure 331 as discussed further herein with respect to FIGS. 3A-3I, transistor structure 407 as discussed further herein with respect to FIGS. 4A-4C, or transistor structure 505 as discussed further herein with respect to FIGS. 5A-5C. However, process 200 may be used to fabricate any transistor structures herein.

Figure 4A:
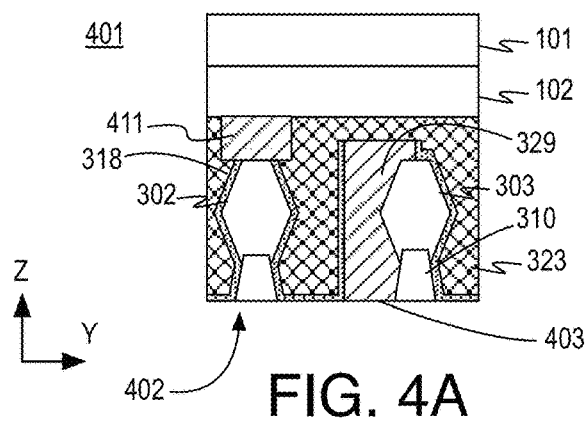
FIGS. 4A, 4B, and 4C illustrate cross-sectional side views of example transistor structures as particular fabrication operations are performed to provide back-side coupling to the deep via wrap around metallization contacts.
Figure 4B:
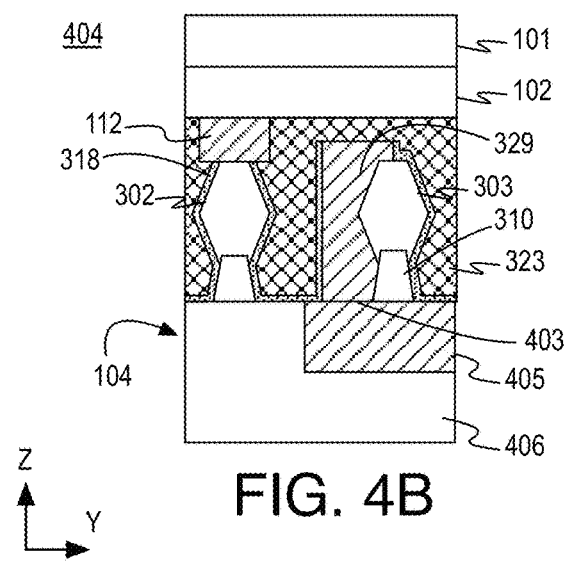
Figure 4C:
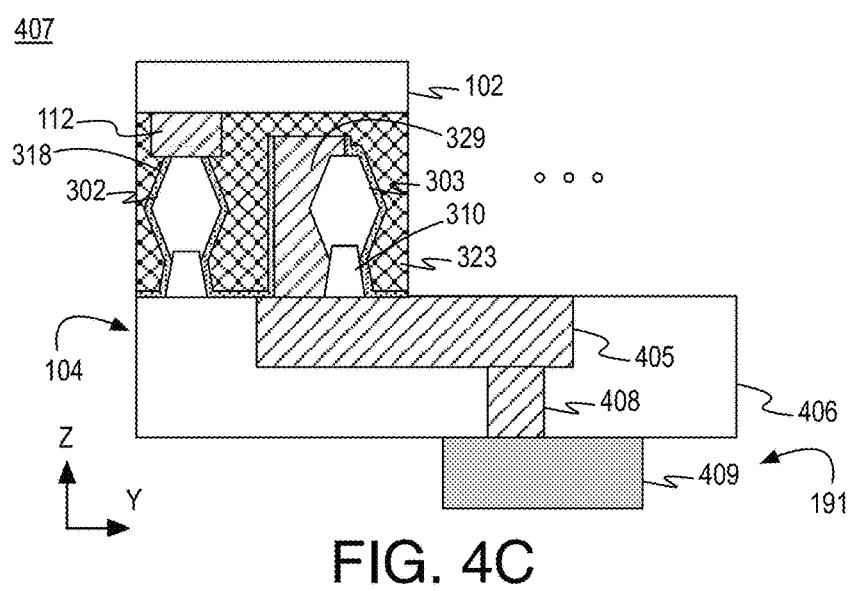
Figure 5A:
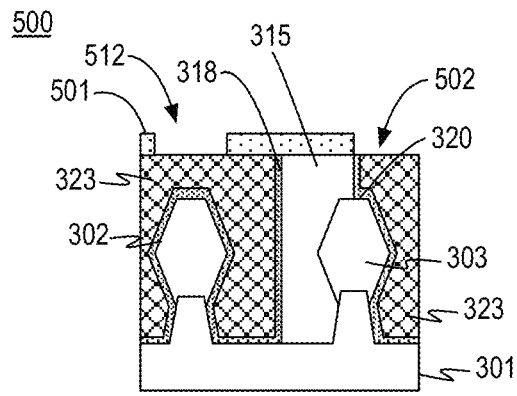
FIGS. 5A, 5B, and 5C illustrate cross-sectional side views of example transistor structures as particular fabrication operations are performed to provide co-metallization of the deep via wrap around metallization contacts and trench contacts.
Figure 5B:
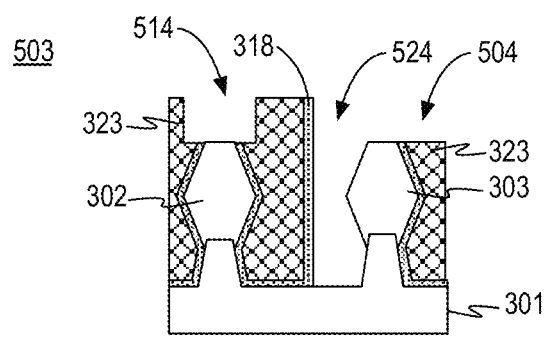
Figure 5C:
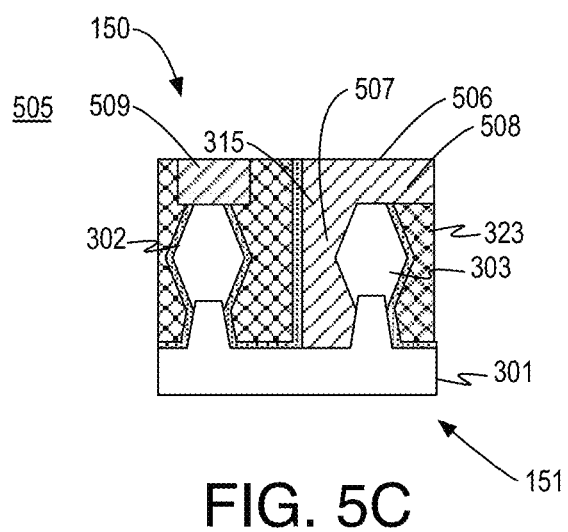

FIGS. 3A, 3B, 3C, 3D, 3E, 3F, 3G, 3H, and 3I illustrate top-down and selected cross-sectional side views of example transistor structures as particular fabrication operations are performed to generate deep via wrap around metallization contacts for source and/or drain regions, arranged in accordance with at least some implementations of the present disclosure. FIGS. 4A, 4B, and 4C illustrate cross-sectional side views of example transistor structures as particular fabrication operations are performed to provide back-side coupling to the deep via wrap around metallization contacts, arranged in accordance with at least some implementations of the present disclosure. FIGS. 5A, 5B, and 5C illustrate cross-sectional side views of example transistor structures as particular fabrication operations are performed to provide co-metallization of the deep via wrap around metallization contacts and trench contacts, arranged in accordance with at least some implementations of the present disclosure. Discussion of process 200 will be made with respect to such exemplary embodiments; however, other transistor structures may be formed using the operations of process 200.

Process 200 begins at operation 201, where a transistor structure work piece is received for processing. For example, transistor structures (e.g., NMOS and/or PMOS transistor structures) may be formed on and over a substrate. The substrate may include any suitable substrate such as a silicon wafer or the like. The transistor structures may be planar, multi-gate, or gate all around transistor structures formed using techniques known in the art. In the following, gate all around transistor structures are illustrated for the sake of clarity of presentation. In some embodiments, the transistor structure includes a one or more channel semiconductors covered by a gate structure or a dummy gate structure (which will later be removed and replaced by a gate structure). The transistor structure includes exposed portions of the one or more channel semiconductors and exposed portions of a substrate suitable for epitaxial growth of source and drain semiconductor bodies.

Processing continues at operation 202, where epitaxial source and drain semiconductor bodies are grown on the exposed channel semiconductor(s) and substrate portion. The epitaxial source and drain semiconductor bodies may be grown using any suitable technique or techniques. In some embodiments, epitaxial source and drain semiconductor bodies are grown from a single crystal substrate portion and/or single crystal channel semiconductor materials.

Figure 3A:
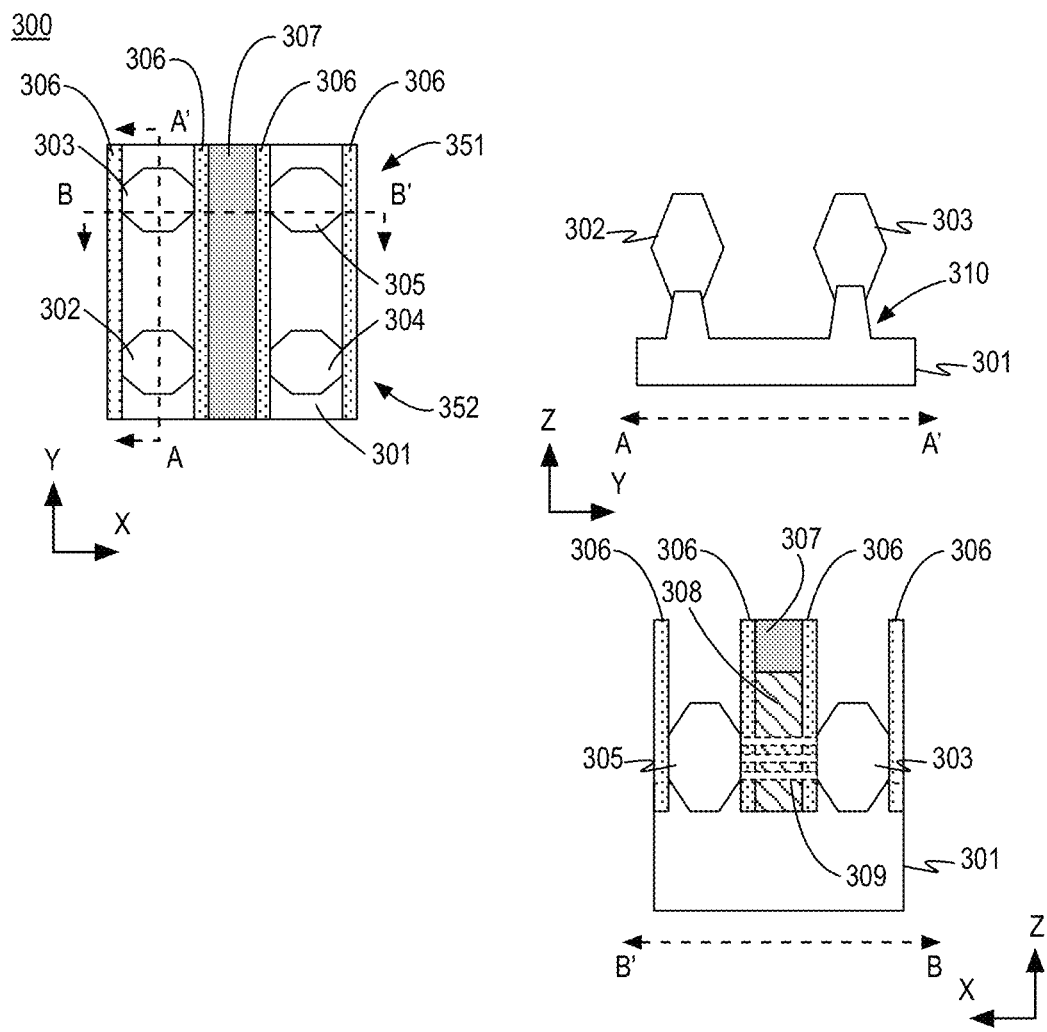
FIGS. 3A, 3B, 3C, 3D, 3E, 3F, 3G, 3H, and 3I illustrate top-down and selected cross-sectional side views of example transistor structures as particular fabrication operations are performed to generate deep via wrap around metallization contacts for source and/or drain regions.

FIG. 3A illustrates an example transistor structure 300 after epitaxial source and drain semiconductor bodies are grown or deposited. In FIG. 3A, a top down view of a front-side of transistor structure 300 is illustrated along with cross sectional views taken along the A-A' cross section (e.g., in the y-z plane), which cuts across a source 303 of a transistor 351 and a drain 302 of an adjacent transistor 352, and along the B-B' cross section (e.g., in the x-z plane), which cuts across along transistor 351 and includes a portion of source 303, drain 305, and a gate structure thereof. In the B-B' cross section, channel regions 309 (e.g., channel semiconductors or nanoribbons) are illustrated in dashed lines as there are slightly out of plane with respect to the B-B' cross section. Such channel regions 309 are not shown in subsequent illustrations for the sake of clarity. Transistor structure 300 includes a transistor 351 and a transistor 352. Transistor 351 includes source 303, a drain 305, and channel regions 309. Transistor 352 includes a source 304, a drain 302, and channel regions (not shown) in analogy to channel regions 309.

As shown, transistor structure 300 is formed on and over a substrate 301. Substrate 301 may include any suitable material and, in some embodiments, substrate 301 has the same or a similar composition with respect to channel regions 309. In some embodiments, substrate 301 and channel regions 309 include a Group IV material (e.g., silicon). In some embodiments, substrate 301 and channel regions 309 include a substantially monocrystalline material. In some embodiments, substrate 301 includes a buried insulator layer (e.g., $SiO_2$), for example, of a semiconductor-on-insulator (SOI) substrate. Transistor structure 300 further includes a gate structure including a material 308 such as polysilicon and a hardmask 307 over material 308 and within sidewall spacers 306. Spacers 306 may include any suitable material such as silicon nitride (e.g., spacers 306 may include silicon and nitrogen). In some embodiments, spacer 306 extends over hardmask 307. In some embodiments, an additional layer may be provided over hardmask 307 that extends laterally over the top regions of spacers 306 adjacent hardmask 307. Notably, material 308 and hardmask 307 may be subsequently removed and replaced using replacement gate techniques or they may be formed over gate electrode and gate contact structures. In either event, the transistor structure 300, upon completion of fabrication may include a gate all around structure including a gate dielectric on channel regions 309 (and the channel regions of transistor 352) and a gate electrode on the gate dielectric. Furthermore, a gate contact (not shown) may contact the gate electrode.

Source 303, drain 305, source 304, and drain 302 may be formed on an exposed ridge 310 of substrate 301. For example, ridge 310 may be formed from substrate 301 using etch processing. Source 303, drain 305, source 304, and drain 302 may include any suitable source and drain materials. In some embodiments, an epitaxial silicon and germanium based material is used. In some embodiments, the source/drain semiconductor is a group IV materials (e.g., Si, Ge, SiGe), and/or group III-V materials (e.g., InGaAs, InAs). In some embodiments, the source and drain material employed is heavily-doped with electrically active impurities imparting n-type or p-type conductivity. For exemplary embodiments where transistor structure 100 is a conventional field effect transistor, both the source and drain semiconductor materials may be doped to the same conductivity type (e.g., n-type for NMOS and p-type for PMOS). In alternative embodiments (e.g., for a tunneling field effect transistor), the source/drain semiconductor materials may be doped complementarily. As shown, sources 303, 304 and drains 305, 302 may extend between adjacent portions of sidewall spacers 306.

In the context of transistor structure 300, source 303, drain 305, source 304, and drain 302 and portions of substrate 301 (or a dielectric on substrate 301, not shown) are exposed. Notably, subsequent processing may advantageously be self-aligned with trenches that expose source 303, drain 305, source 304, and drain 302.

Returning to FIG. 2, processing continues at operation 203, where a fill material and a hardmask are deposited on and over the transistor structure. The fill material may be deposited using any suitable technique or techniques such as chemical vapor deposition (CVD) or physical vapor deposition (PVD). Similarly, the hardmask layer over the fill material may be deposited using CVD or PVD. The fill material may be any suitable material that provides etch selectivity with respect to a subsequent dielectric fill material such as a flowable oxide material. In some embodiments, the fill material is a carbon hardmask material such as a spin on carbon material inclusive of amorphous carbon deposited using CVD. The hardmask material may be any suitable material that provides an etch mask for the fill material. In some embodiments, the hardmask is a silicon based material such as a silicon topcoat.

Figure 3B:
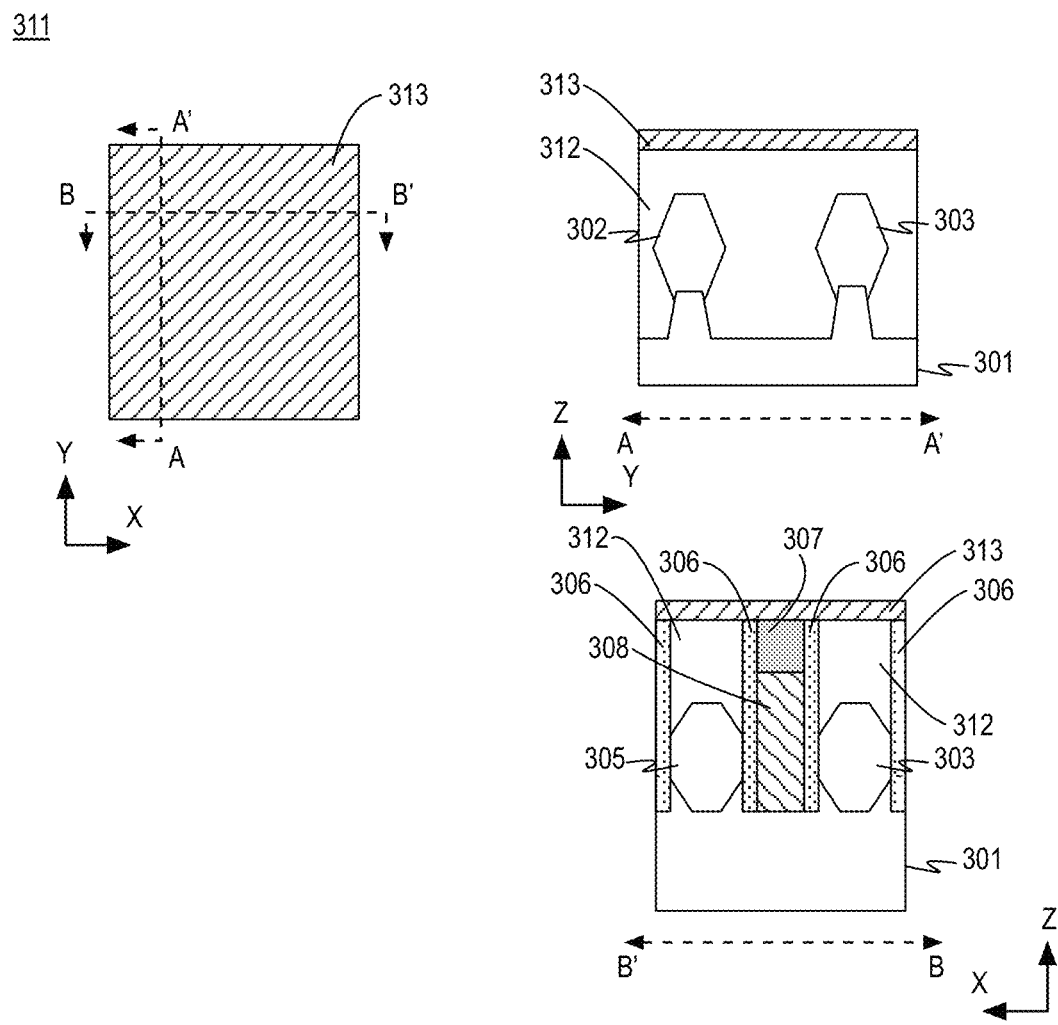

FIG. 3B illustrates an example transistor structure 311 similar to transistor structure 300 after deposition of a fill material 312 and a hardmask layer 313. As shown, fill material 312 fills the trench and voids adjacent source 303, drain 305, source 304, and drain 302 with the fill material. In some embodiments, a top surface of fill material 312 is substantially aligned with top surfaces of spacers 306 and hardmask 307. In some embodiments, the top surface of fill material 312 is substantially aligned with top surfaces of spacers 306, with spacer 306 also extending over a top of hardmask 307. In some embodiments, a planar operation may be performed to substantially align such top surfaces. In some embodiments, a top surface of fill material 312 is over the top surfaces of spacers 306 and hardmask 307. Fill material 312 may be any suitable material such a carbon hardmask material. Hardmask layer 313 is on fill material 312 and will provide a patterning etch mask in place of photoresist for improved patterning of fill material 312. Hardmask layer 313 may be any suitable material such as a silicon based material.

Returning to FIG. 2, processing continues at operation 204, where the hardmask is patterned and the pattern is transferred to the fill material. The hardmask may be patterned using any suitable technique or techniques such as lithography techniques. In some embodiments, resist is spun on and patterned and the pattern is transferred to a silicon based hardmask using a sulfur hexafluoride and octafluorocyclobutane gas mixture. However, any suitable chemistries may be employed. The pattern of the hardmask is then transferred to the fill material using any suitable technique or techniques such as etch techniques. In some embodiments, a carbon hardmask material is etched using an oxygen plasma etch or a hydrogen plasma etch that are highly selective with respect to a silicon based hardmask although other materials and etch chemistries may be used.

Figure 3C:
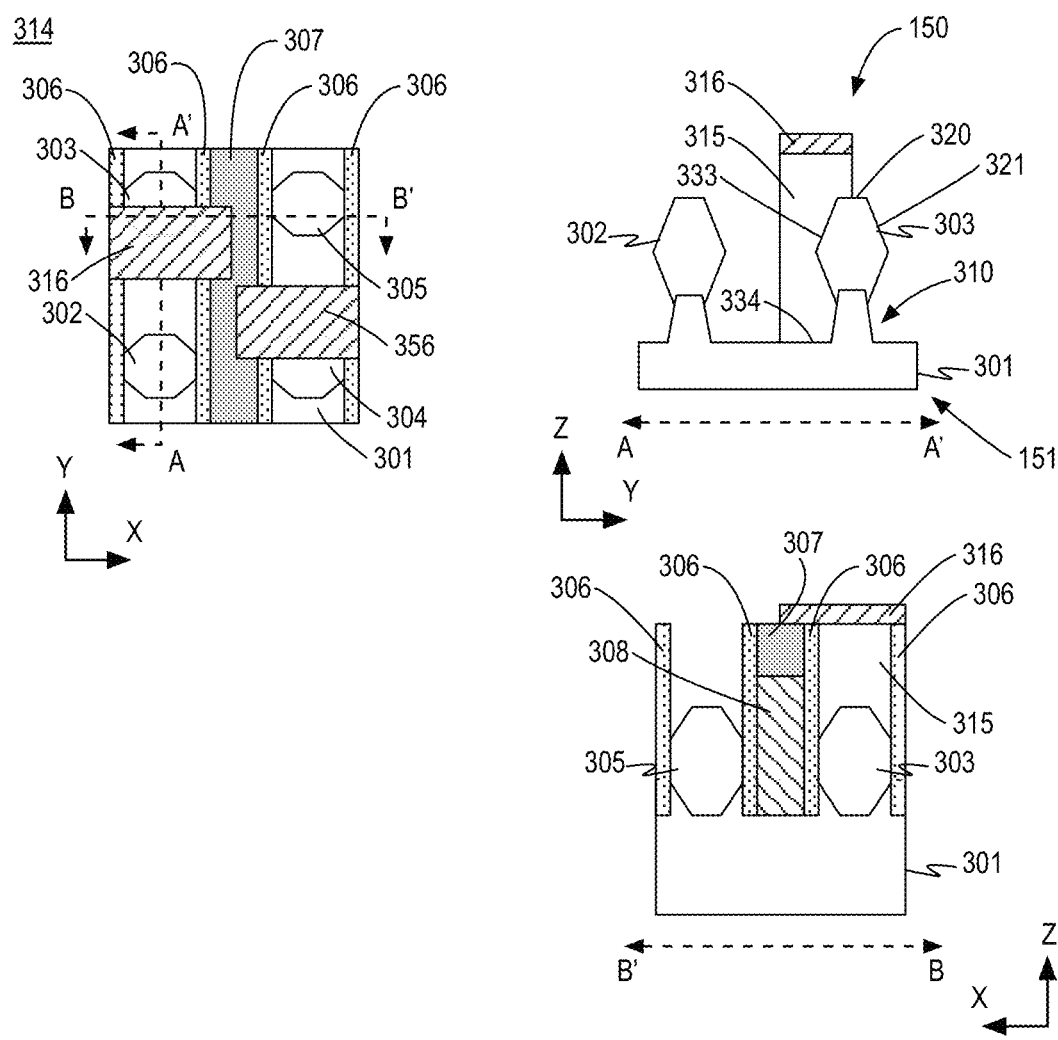

FIG. 3C illustrates an example transistor structure 314 similar to transistor structure 311 after patterning hardmask layer 313 and fill material 312 to form material plugs including a material plug 315 and capping layers including capping layer 316 (over material plug 315) and capping layer 356 (over a material plug, not shown). The following discussion is presented relative to material plug 315 and capping layer 316, but may apply to any material plug of transistor structure 311. Notably, material plug 315 is formed in a location at which a subsequent wrap around contact metallization is to be formed. As shown, material plug 315 remains on at least a portion of a top surface 320 of source 303. As used herein, the term top surface indicates a surface proximal to front-side 150 of the transistor structure. As discussed, front-side 150 is in a build-up direction of the transistor structure and is opposite a substrate. For example, front-side 150 is distal to substrate 301 or opposite substrate 301 with respect to source 303, drain 305, source 304, and drain 302 as well as channel regions 309 and all non-metallization layer components of the transistor structure. In contrast, back-side 151, which is opposite front-side 150, is proximal to substrate 301 as well as source 303, drain 305, source 304, and drain 302 and channel regions 309. Notably, front-side contact may be made to transistor structure 314 from the positive z-direction and back-side contact may be made to transistor structure 314 from the negative z-direction.

Material plug 315 further remains on a side surface 333 of source 303 while being removed from an opposite side surface 321 of source 303. As illustrated herein, source 303, drain 305, source 304, and drain 302 may be faceted bodies due to their epitaxial growth. The terms top surface, side surface, bottom surface, and so on indicate surfaces that extend substantially in such directions and between points of the body defining an end of other adjacent surfaces. Furthermore, such surfaces need not be planar. For example, a top surface may be defined as a surface having a surface normal that is within 25° of the z-axis. Similarly, a side surface may be defined as a surface having a surface normal that is within 25° of the x-y plane. Therefore, the terms top surface, bottom surface, and side surface do not indicate that the surfaces are exactly parallel to any particular plane. For example, a top surface may be at or near a top of source 303 but a top surface does not necessarily run parallel to the x-y plane. Furthermore, a top surface need not include the top-most point of the body it references. Similarly, and as shown with respect to side surfaces 333, 321, a side surface may not extend parallel to the z-direction.

As discussed, material plug 315 is on at least a portion of top surface 320 and at least a portion of side surface 333. Material plug 315 also extends beyond a bottom of source 303 to a surface 334 that is substantially parallel with the x-y plane and that is at a height (in the z-dimension) at which ridge 310 begins to extend above a bulk of substrate 301. As is discussed further herein, the bulk of substrate 301 may be removed in back-side reveal processing to expose and isolate ridge 310. The corresponding conductive fill may also be exposed and extend beyond source 303 in the negative z-direction. As shown, capping layer 316 may extend over portions of spacer 306 and hardmask 307. Such processing may advantageously expand the patterning process window for improved process reliability.

Returning to FIG. 2, processing continues at operation 205, where a conformal liner material is formed over the exposed structures and, in particular, over portions of to source 303, drain 305, source 304, and drain 302 that will be subsequently covered by dielectric material. Notably, the formation of the dielectric material, if in contact with source 303, drain 305, source 304, and drain 302 may cause damage or other unwanted processing on the delicate epitaxial material thereof. For example, if exposed during dielectric material deposition, the epitaxial material of source 303, drain 305, source 304, and drain 302 may form unwanted oxide, which hinders electrical performance. Furthermore, if exposed during dielectric material deposition, the epitaxial material of source 303, drain 305, source 304, and drain 302 may be damaged, which may cause poor electrical performance or even device failure.

The conformal liner material may be formed using any suitable technique or techniques such as CVD or PVD. The conformal liner material may include any material layer or material stack that provides protection for source 303, drain 305, source 304, and drain 302. In some embodiments, the conformal liner material includes nitrogen. In some embodiments, the conformal liner material includes silicon and nitrogen. In some embodiments, the conformal liner material includes silicon nitride. In some embodiments, the conformal liner material includes aluminum and nitrogen. In some embodiments, the conformal liner material includes aluminum nitride. In some embodiments, the conformal liner material includes carbon. In some embodiments, the conformal liner material includes silicon and carbon. In some embodiments, the conformal liner material includes silicon carbide. Other materials may be employed.

Figure 3D:
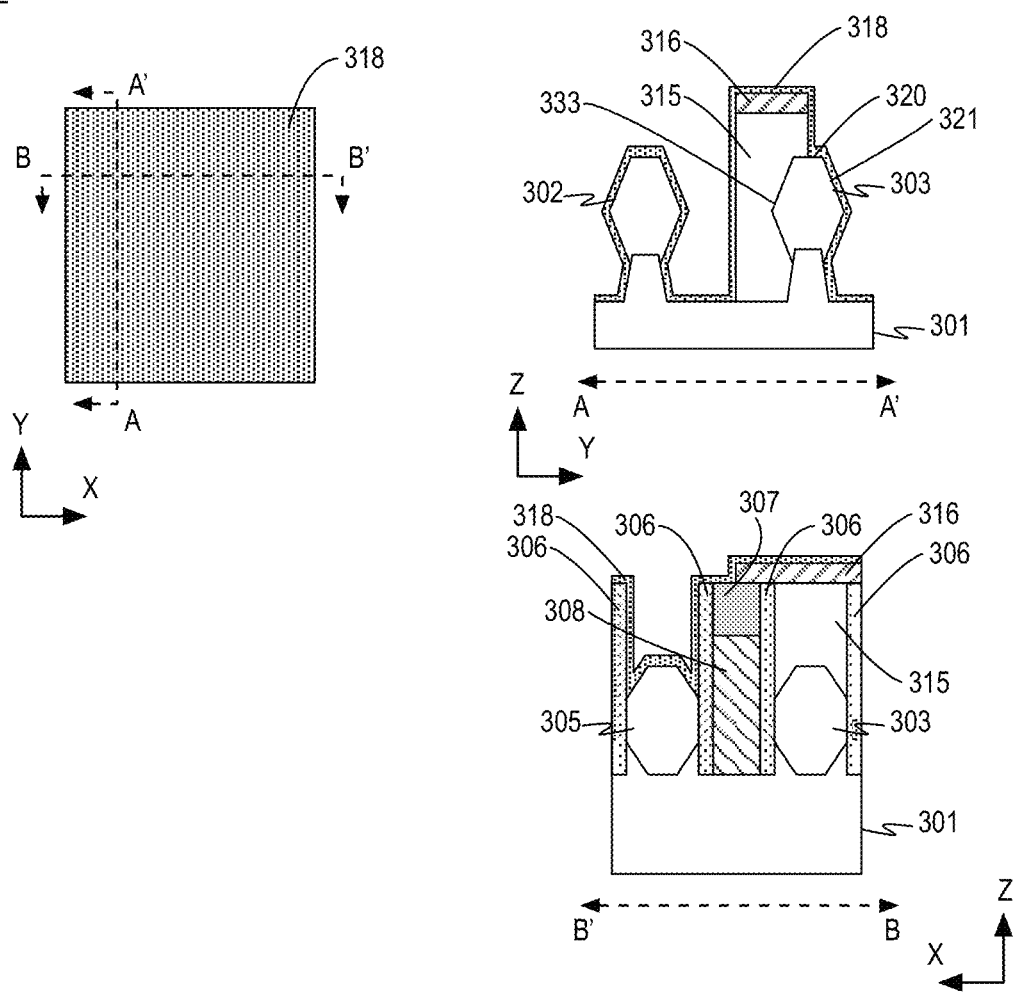

FIG. 3D illustrates an example transistor structure 317 similar to transistor structure 314 after the deposition of protective conformal liner 318. As shown, protective conformal liner 318 may be formed on or over all exposed surfaces of transistor structure 314. Protective conformal liner 318 may include any material discussed with respect to operation 205 such as silicon nitride, aluminum nitride, silicon carbide, or others. In some embodiments, a multiple layer stack of such materials are used. Protective conformal liner 318 may have any suitable thickness. In some embodiments, protective conformal liner 318 has a thickness in the range of 3 to 10 nm. In some embodiments, protective conformal liner 318 has a thickness in the range of 8 to 15 nm. In some embodiments, protective conformal liner 318 has a thickness in the range of 12 to 25 nm. other thickness may be used.

As shown, protective conformal liner 318 is formed over and on exposed portions of material plug 315, capping layer 316, hardmask 307, spacer 306, source 303, drain 305, source 304, and drain 302. In the following, reference is made to source 303 and drain 305; however, such features may correspond to any sources and/or drains of transistor structure 317. For example, protective conformal liner 318 is on at least a portion of side surface 321 of source 303 and is optionally on a portion of top surface 320 of source 303. Furthermore, protective conformal liner 318 is on an exposed surface of ridge 310. Also as shown, protective conformal liner 318 is on a top surface and exposed side surfaces of drain 305 and drain 302.

Returning to FIG. 2, processing continues at operation 206, where a dielectric material is deposited and subsequently polished to expose the patterned fill material. The dielectric material may be deposited using any suitable technique or techniques such that the dielectric material provides a fill around the patterned fill material (e.g., material plugs). Furthermore, any dielectric material having etch selectivity relative to the material of the previously patterned plugs may be used. In some embodiments, the dielectric material is a flowable oxide material. A planarization operation is then performed to expose top surfaces of the patterned fill material (e.g., material plugs). The planarization operation may be performed using any suitable technique or techniques such as chemical mechanical polish techniques. It is noted that such planarization techniques expose the patterned fill material (e.g., material plugs) and top surfaces of the protective conformal liner around such patterned fill materials.

Figure 3E:
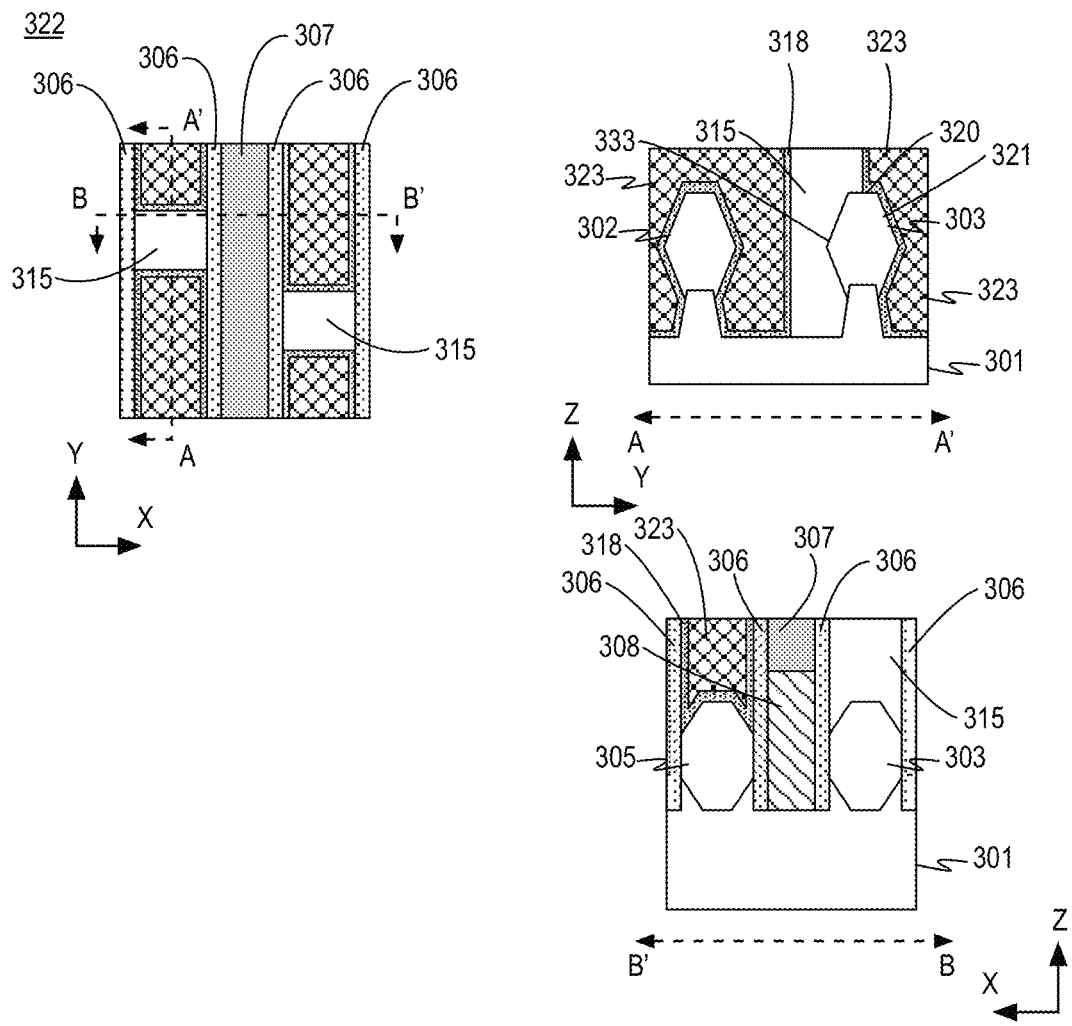

FIG. 3E illustrates an example transistor structure 322 similar to transistor structure 317 after the deposition of a dielectric material and subsequent planarization to form dielectric fill material 323. In some embodiments, a flowable oxide material is deposited to provide a fill material and the subsequent structure is planarized (e.g., via chemical mechanical polishing) to provide transistor structure 322. As shown, dielectric fill material 323 is provided within prior voids and over exposed portions of source 303, drain 305, source 304, and drain 302 but not in contact with such materials due to protective conformal liner 318. Notably, during such deposition processing protective conformal liner 318 protects otherwise exposed portions of source 303, drain 305, source 304, and drain 302.

Returning to FIG. 2, processing continues at operation 207, where the patterned fill material is removed to expose deep vias over and adjacent at least portions of the sources and/or drains. Notably, after operation 207, the previously patterned fill material (e.g., material plugs) is exposed. The exposed patterned fill material is adjacent exposed portions of the protective conformal liner, spacers, and the dielectric fill material. Using selective etch techniques such as ashing techniques (e.g., use of oxygen plasma or hydrogen plasma etch) the exposed patterned fill material (e.g., a carbon hardmask material) is selectively removed relative to the protective conformal liner, spacers, and the dielectric fill material.

Figure 3F:
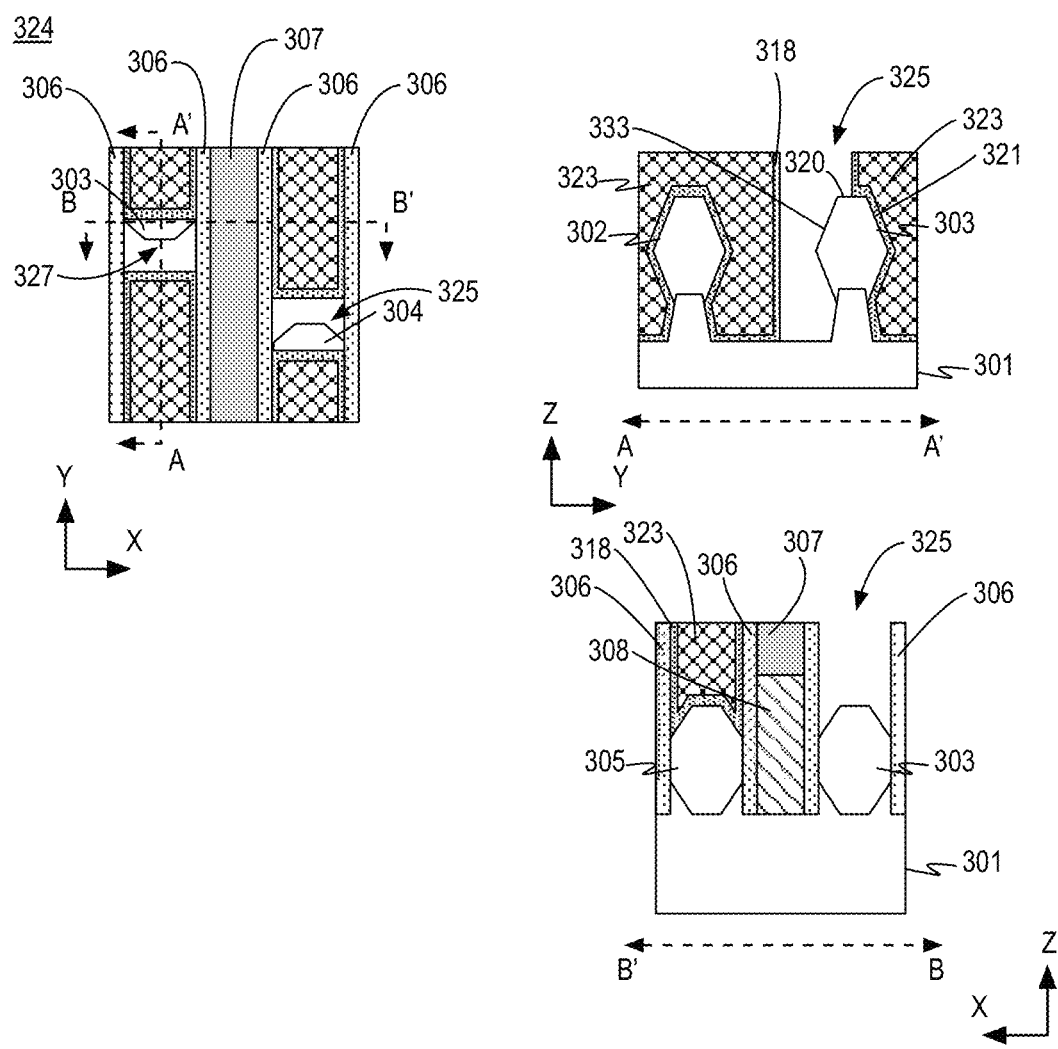

FIG. 3F illustrates an example transistor structure 324 similar to transistor structure 322 after the removal of patterned material plugs 315 to form deep vias 325, 327. As shown, removal of patterned material plugs 315 exposes portions of source 303 and source 304 at locations where deep metallization in deep vias 325, 327 are to be deployed. Notably, a portion of top surface 320 and side surface 333 of source 303 are exposed while a portion of top surface 320, side surface 321, drain 305, and drain 302 are covered by protective conformal liner 318 and dielectric fill material 323.

Returning to FIG. 2, processing continues at operation 208, where exposed portions of the epitaxial sources and/or drains onto which metallization is to be applied may be trimmed Such trim processing may remove damage at the exposed surfaces of the epitaxial sources and/or drains, for example. Such trim processing may be performed any suitable technique or techniques such as a etch processing. The trim may remove any thickness of exposed epitaxial material. In some embodiments, 1 to 2 nm of material is removed. In some embodiments, not more than 2 nm of material is removed. In some embodiments, not more than 4 nm of material is removed.

Figure 3G:
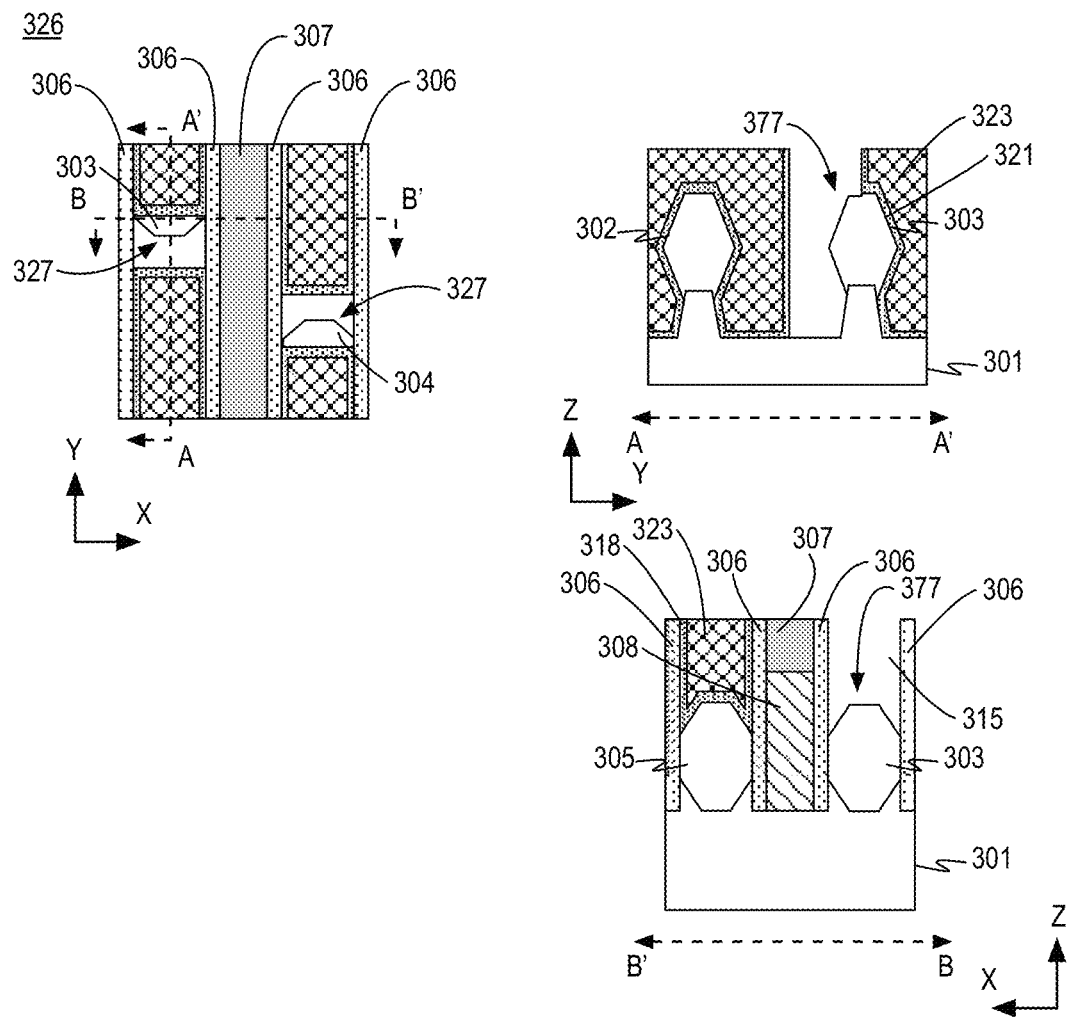

FIG. 3G illustrates an example transistor structure 326 similar to transistor structure 324 after the removal of a portion of exposed surfaces of source 303 and source 304. As discussed, such trim processing may be performed using etch techniques to remove a thickness of the exposed portions to remove damage to the epitaxial material. Such damage removal may improve contact to the epitaxial material and reduce resistance due to the damage itself and poor contact due to the damage, for example. As shown, such epitaxial trim processing forms a recess 377 in source 303 and an analogous recess in source 304 (not shown). In some embodiments, a subsequent metallization, as discussed herein below, is in contact with a region of source 303 (or a drain if a wrap around contact to a drain is employed), such that the region includes recess 377 in source 303. Notably, side surface 321 is not affected by recess 377 such that source 303 has a pronounced lack of symmetry about an x-y plane extending down a centerline of source 303. In the following examples, recess 377 is not illustrated for the sake of clarity of presentation; however, it is to be understood that recess 377 may be employed in any of the embodiments.

Returning to FIG. 2, processing continues at operation 209, where the exposed vias generated by removal of patterned fill material at operation 207 are filled with contact metallization and optionally recessed. The exposed vias may be filled with contact metallization using any suitable technique or techniques such as CVD, sputter, electroplating or the like. In some embodiments, a seed layer may be deposited prior to a metal fill material. The contact metallization may employ any suitable metal. In some embodiments, the contact metallization includes tungsten. In some embodiments, the contact metallization includes cobalt. the contact metallization includes ruthenium. In some embodiments, the contact metallization includes molybdenum. Combinations of such materials may be used or other metals may be deployed. Notably, the contact metallization is in contact with a top surface and side surface of the exposed source or drain. Furthermore, the contact metallization extends below the source or drain to a position where it may be contacted from a back-side of the transistor structure. After such back-side reveal (e.g., using back-side grind or etch techniques), the contact metallization is contacted by a back-side metal interconnect over the back-side of the transistor structure. The contact metallization may be recessed using any suitable technique or techniques such as chemical mechanical polish techniques. However, in some embodiments, such recess techniques may not be deployed.

Figure 3H:
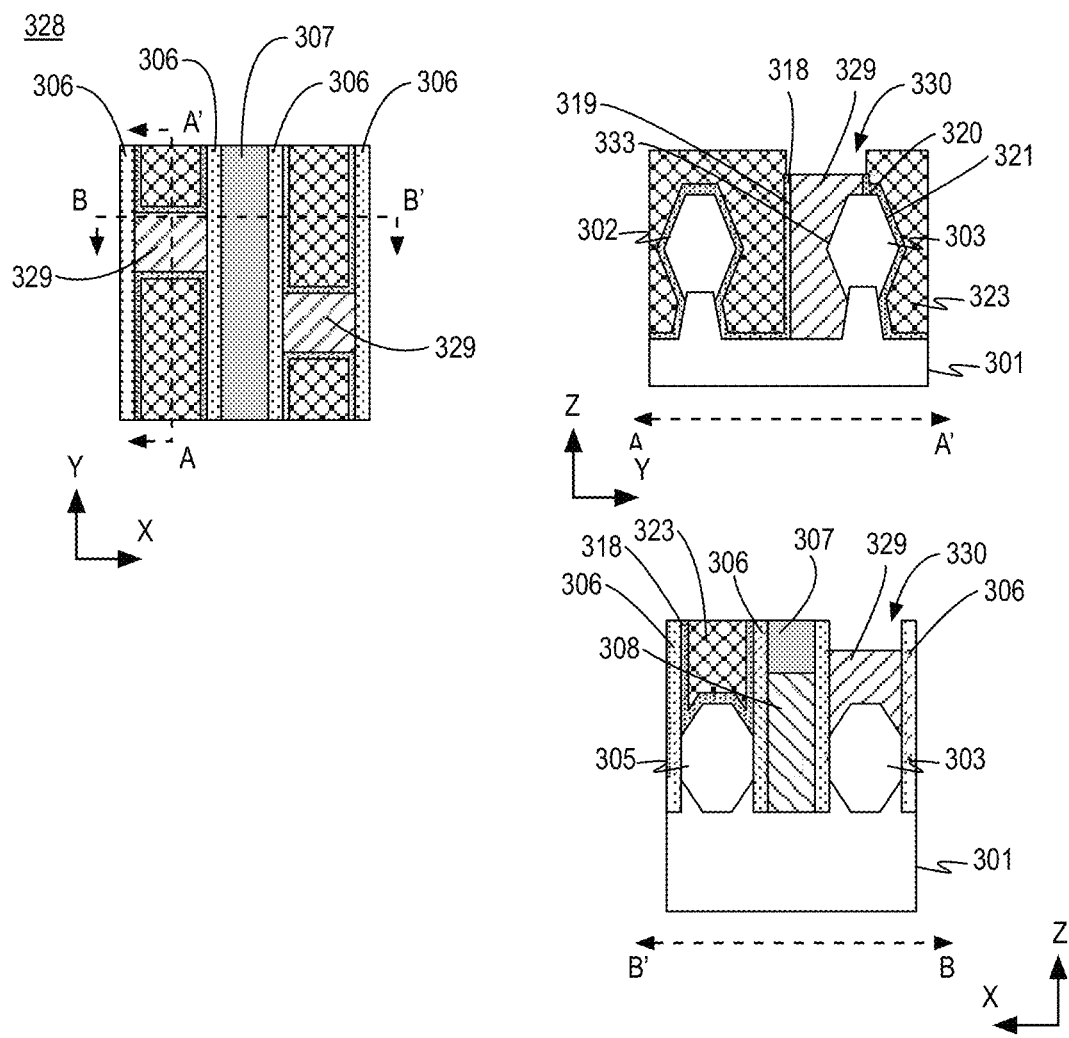

FIG. 3H illustrates an example transistor structure 328 similar to transistor structure 326 after metallization fill processing and recess to form contact metallization 329. As shown, contact metallization 329 is on a portion of top surface 320 and side surface 333 of source 303.

Furthermore, contact metallization 329 extends below a bottom of source 303 for eventual back-side contact as discussed further herein below. As discussed, contact metallization 329 may include any suitable metal material or materials such as tungsten, cobalt, ruthenium, molybdenum, or the like. As shown, protective conformal liner 318 is on a side surface 319 of contact metallization 329 opposite side surface 333 with respect to contact metallization 329. Also as shown, sidewall surface side surface 321 of source 303 is absent contact metallization 329 while being covered by protective conformal liner 318 and dielectric fill material 323. As discussed, protective conformal liner 318 protects source 303 during application of dielectric fill material 323 to improve the electrical performance of source 303 in the implementation of contact metallization 329.

In some embodiments, a recess 330 (or gap) is provided above contact metallization 329 and between spacers 306 and dielectric fill material 323. In some embodiments, as shown, such recess processing may remove exposed portions of protective conformal liner 318. In other embodiments, protective conformal liner 318 remains on sidewall surfaces of dielectric fill material 323. In some embodiments, recess processing is not employed and a top surface of contact metallization 329 may be substantially planar with respect to spacers 306, hardmask 307, and dielectric fill material 323.

In some embodiments, such processing provides a deep via metallization adjacent side surface 333 of source 303. A trench contact metallization may also be provided on sources 303, 304 (as well as on drains 302, 305) as discussed with respect to FIGS. 1A and 1B. Such trench contact metallization (e.g., trenches that run substantially perpendicular to the source-gate-drain axis of the transistor(s)) may be formed subsequent to the deep via metallization by patterning trenches to expose the tops of the sources and/or drains (as well as the deep via metallization if present) and filling the trenches with contact metal. In other embodiments, the trenches may be formed (prior to or subsequent) to the patterned deep vias (absent metallization) and the patterned deep vias and trenches may be metallized in the same process (e.g., they may be co-metallized). Such techniques with patterning prior to the formation of deep vias are illustrated herein below with respect to FIGS. 5A, 5B, and 5C.

Returning to FIG. 2, processing continues at operation 210, where an optional dielectric cap is applied and polish processing may be employed. For example, after application of the deep via metallization, the deep via metallization may be buried in dielectric material and the dielectric material may be planarized. Thereby, the deep via metallization is isolated from, for example, front-side metal interconnect layer 102. As discussed, trench metallization may also be deployed for the sources and/or drains contacted by deep via metallization. In some embodiments, the dielectric cap (or a dielectric layer) is provided over the trench metallization and the deep via metallization. The buried trench metallization may then be selectively contacted by vias of front-side metal interconnect layer 102. For example, front-side metal interconnect layer 102 may contact only drains while front-side metal interconnect layer 102 does not contact sources, which are contacted by back-side metal interconnect layer 104 for back-side power delivery.

Figure 3I:
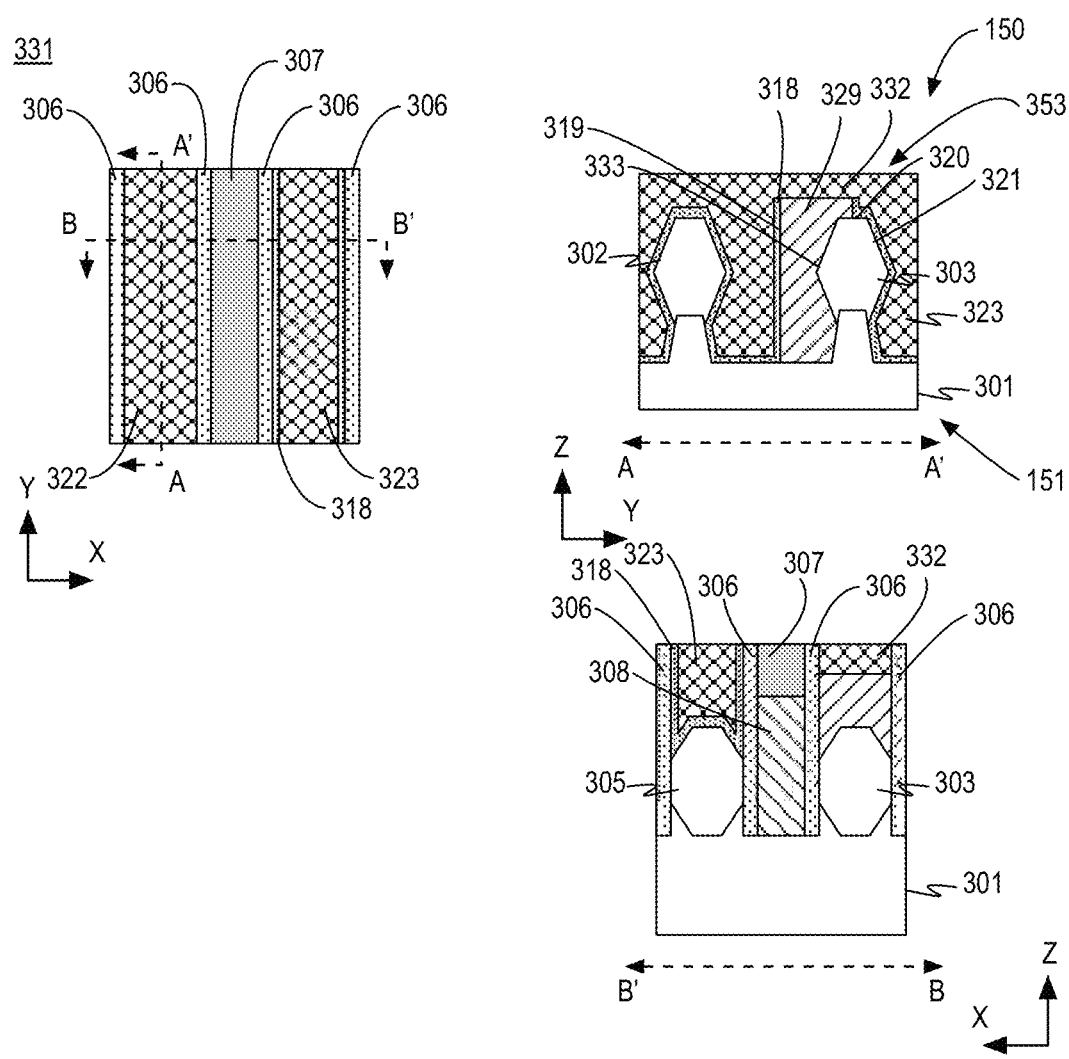

FIG. 3I illustrates an example transistor structure 331 similar to transistor structure 328 after application of a dielectric cap and planarization processing. For example, a dielectric material such as an oxide may be deposited using CVD and chemical mechanical polishing may be performed to provide a substantially planar top surface. Although illustrated as a substantially continuous dielectric material 353 including dielectric fill material 323 and a dielectric cap 332, a material boundary may exist therebetween. In the embodiment of FIG. 3I, a buried deep via contact metallization 329 is provided in contact with source 303 and source 304. As discussed, such processing may be used to contact any source and/or drain of the transistor structure. Subsequent processing may then couple to contact metallization 329 from back-side 151 as discussed further herein below. Furthermore, in prior processing, drain 302 and drain 305 may be contacted from front-side 150 using trench contacts or any other contact shape. Exemplary front-side and back-side contacts are discussed with respect to FIGS. 4A, 4B, and 4C and exemplary trench contacts are discussed with respect to FIGS. 5A, 5B, and 5C. However, such front- and back-side coupling techniques are not meant to be limiting as the discussed deep via contact metallization 329 may be deployed in a variety of architectures.

Returning to FIG. 2, processing continues at operation 210, where the deep via contact metallization is exposed from a back-side of the transistor structure and coupled to back-side interconnects. The deep via contact metallization may be exposed from the back-side using any suitable technique or techniques. In some embodiments, front-side interconnects are formed (e.g., as layers of metal lines and vias embedded in dielectric material) such that the front-side interconnects include contacts to gate structures and drains of the transistor devices as well as metal interconnect layers (e.g., 6 to 8 metallization layers) to interconnect the transistor devices and other devices of an integrated circuit (IC) After completion of the transistor devices, formation of the front-side interconnects and other optional processing, the front-side may be secured to a carrier wafer and the back-side may be expose by back-side grind, back-side etch, or the like. Once the back side of the device, inclusive of the deep via contact metallization, is exposed, back-side interconnects are formed in a similar manner to the front-side interconnects (e.g., as one or more layers of metal lines and optional vias embedded in dielectric material). Bumps or other I/O connections may then be applied for eventual connection to other devices via a package, for example. In some embodiments, power is delivered to the back-side of the IC while signal routing is delivered via the front-side of the IC; however, a wide variety of architectures may be used.

FIG. 4A illustrates an example transistor structure 401 similar to transistor structure 331 after formation of a contact metallization 411 to drain 302, formation of front-side metal interconnect layer 102, attachment to carrier substrate 101 are back side substrate removal to expose back-side 402. For example, contact metallization 411 may be formed using any suitable technique or techniques such as patterning, etch, metal deposition, and planarization operations. In some embodiments, contact metallization 411 is a trench contact metallization that extends across and contacts several transistor drains. However, any architectures may be used. In some embodiments, contact metallization 411 is formed with a source trench metallization as discussed with respect to FIGS. 5A, 5B, and 5C.

After formation of drain contact metallization 411, front-side metal interconnect layer 102 may be formed using any suitable technique or techniques such as dual-damascene processing or the like. As discussed, front-side metal interconnect layer 102 may include layers of metal lines and vias embedded in dielectric material and front-side metal interconnect layer 102 may provide routing to devices of an IC. The transistor structure work piece may then be attached to carrier substrate 101 using any suitable technique or techniques. Back-side processing such as back-side grind or back-side etch is then employed to remove portions of substrate 301 while leaving ridges 310, for example, as well as exposing a back-side region 403 of deep via contact metallization 329.

FIG. 4B illustrates an example transistor structure 404 similar to transistor structure 401 after formation of a back-side metal interconnect 405 and dielectric layer 406. As shown, back-side metal interconnect 405 and dielectric layer 406 may be a part of back-side metal interconnect layer 104. Back-side metal interconnect 405 and dielectric layer 406 may be formed using any suitable technique or techniques such as bulk application of a dielectric layer, patterning of the dielectric layer, and metal fill although subtractive metal processing may be used. As shown, deep via contact metallization 329 is in contact with back-side metal interconnect 405, which may be a contact, via, metal line, or the like.

FIG. 4C illustrates an example transistor structure 407 similar to transistor structure 404 after formation of a back-side metal interconnect 408 and an external interconnect 409. Back-side metal interconnect 408, along with back-side metal interconnect 405 and dielectric layer 406, may be a part of back-side metal interconnect layer 104 that provides routing to transistors of transistor structure 407. Back-side metal interconnect 408 may be formed using any suitable technique or techniques such as those discussed with respect to back-side metal interconnect 408. External interconnect 409 may be formed using electroplating processes, bond-pad processing, or the like. Transistor structure 407 may be packaged into a device in accordance with any system, computing device, mobile device, etc. discussed herein.

Discussion now turns to co-metallization processes for forming deep via contact metallization and trench metallization concurrently. FIG. 5A illustrates an example transistor structure 500 similar to transistor structure 322 after formation of a patterned layer 501. For example, patterned layer 501 may be a patterned photoresist layer. As shown, patterned layer 501 includes an openings 502, 512 to expose trenches over source 303 and drain 302, respectively, for eventual trench contacts. For example, the trench contact to source 303 may be an additional contact and may strap sources together. For example, the deep via contact metallization may extend to a back-side contact as discussed herein while the trench contact metallization extends to another source that does not have its own deep via contact metallization. Thereby, power may be delivered to multiple sources using one deep via contact metallization for increased transistor cell density.

Furthermore, opening 512 of patterned layer 501 provides eventual contact metallization to drain 302, which may also be a trench contact extending across multiple drains such that the drains may share a contact. For example, with reference to FIG. 1B, opening 512 may provide an opening for shared drain contact 163. Similarly, opening 502 may provide an opening for portion 117 source contact 115. Although not illustrated in FIG. 1B, portion 117 may extend to source contact 116 (providing a single contact metallization) and deep contact portion 126 may not be deployed.

FIG. 5B illustrates an example transistor structure 503 similar to transistor structure 500 after formation of trenches 504, 514 and removal of material plug 315 to form deep via 524. Trenches 504, 514 may be formed using any suitable technique or techniques such as selective and/or timed etch techniques. For example, a timed oxide etch may first be performed to form trenches 504, 514. For example, the oxide etch may be selective to etching oxide materials (e.g., that of dielectric fill material 323) to carbon based materials (e.g., that of material plug 315) and nitride materials (e.g., that of protective conformal liner 318). A nitride etch may then follow to remove protective conformal liner 318 and expose source 303 and drain 302. Material plug 315 is then removed as discussed with respect to operation 207 and FIG. 3F to form deep via 524.

FIG. 5B illustrates an example transistor structure 505 similar to transistor structure 503 after formation of contact metallizations 509, 506 and optional planarization. Contact metallizations 509, 506 may be formed using any techniques such as those discussed with respect to operation 209. Notably, contact metallizations 509, 506 are formed simultaneously and therefore have the same composition. For example, contact metallizations 509, 506 may include any suitable metal material or materials such as tungsten, cobalt, ruthenium, molybdenum, or the like. Furthermore, contact metallization 506 includes a deep via portion 507 and a trench contact portion 508 that, due to being formed simultaneously, do not have a grain boundary therebetween. Such portions are co-metalized (e.g., formed in the same process) and include the same material(s), grain structure, composition, etc. as do contact metallizations 509, 506. Contact metallizations 509, 506 may be covered with dielectric material and contact metallization 509, for example, may be contacted from front-side 150 while deep via portion 507 is contacted from back-side 151 as discussed herein.

Figure 6:
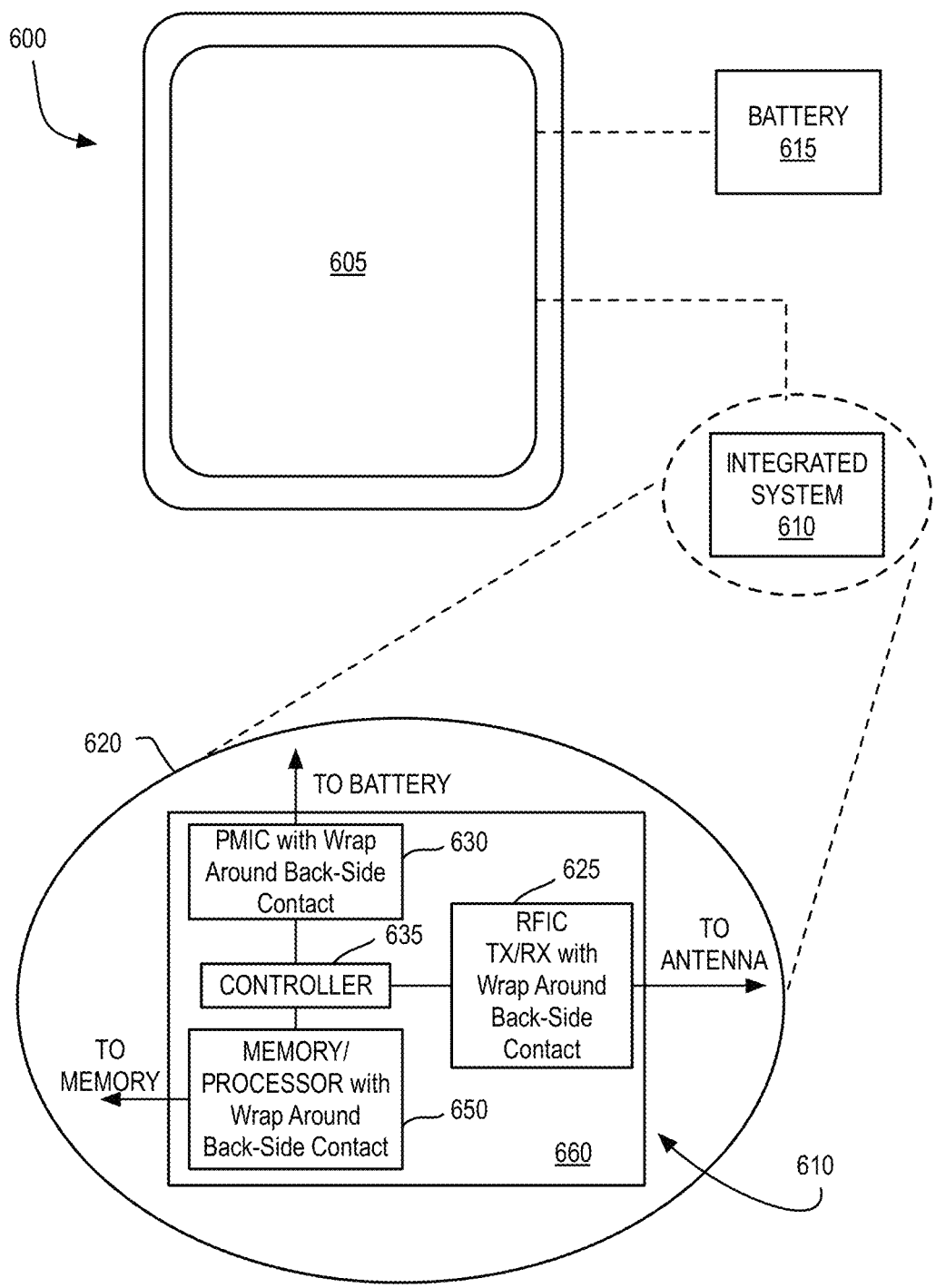
FIG. 6 is an illustrative diagram of a mobile computing platform employing a device having a deep via wrap around metallization contacts from a transistor source or drain to a back-side metallization interconnect.

FIG. 6 is an illustrative diagram of a mobile computing platform 600 employing a device having a deep via wrap around metallization contacts from a transistor source or drain to a back-side metallization interconnect, arranged in accordance with at least some implementations of the present disclosure. Any die or device having a transistor structure inclusive of any components, materials, or characteristics discussed herein may be implemented by any component of mobile computing platform 600. Mobile computing platform 600 may be any portable device configured for each of electronic data display, electronic data processing, wireless electronic data transmission, or the like.

For example, mobile computing platform 600 may be any of a tablet, a smart phone, a netbook, a laptop computer, etc. and may include a display screen 605, which in the exemplary embodiment is a touchscreen (e.g., capacitive, inductive, resistive, etc. touchscreen), a chip-level (system on chip—SoC) or package-level integrated system 610, and a battery 615. Battery 615 may include any suitable device for providing electrical power such as a device consisting of one or more electrochemical cells and electrodes to couple to an outside device. Mobile computing platform 600 may further include a power supply to convert a source power from a source voltage to one or more voltages employed by other devices of mobile computing platform 600.

Integrated system 610 is further illustrated in the expanded view 620. In the exemplary embodiment, packaged device 650 (labeled "Memory/Processor" in FIG. 6) includes at least one memory chip (e.g., RAM), and/or at least one processor chip (e.g., a microprocessor, a multi-core microprocessor, or graphics processor, or the like). In an embodiment, the package device 650 is a microprocessor including an SRAM cache memory. As shown, device 650 may employ a die or device having any transistor structures and/or related characteristics discussed herein. Packaged device 650 may be further coupled to (e.g., communicatively coupled to) a board, a substrate, or an interposer 660 along with, one or more of a power management integrated circuit (PMIC) 630, RF (wireless) integrated circuit (RFIC) 625 including a wideband RF (wireless) transmitter and/or receiver (TX/RX) (e.g., including a digital baseband and an analog front end module further comprises a power amplifier on a transmit path and a low noise amplifier on a receive path), and a controller 635 thereof. In general, packaged device 650 may be also be coupled to (e.g., communicatively coupled to) display screen 605. As shown, one or both of PMIC 630 and/or RFIC 625 may employ a die or device having any transistor structures and/or related characteristics discussed herein.

Functionally, PMIC 630 may perform battery power regulation, DC-to-DC conversion, etc., and so has an input coupled to battery 615 and with an output providing a current supply to other functional modules. In an embodiment, PMIC 630 may perform high voltage operations. As further illustrated, in the exemplary embodiment, RFIC 625 has an output coupled to an antenna (not shown) to implement any of a number of wireless standards or protocols, including but not limited to Wi-Fi (IEEE 602.11 family), WiMAX (IEEE 602.16 family), IEEE 602.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of packaged device 650 or within a single IC (SoC) coupled to the package substrate of the packaged device 650.

Figure 7:
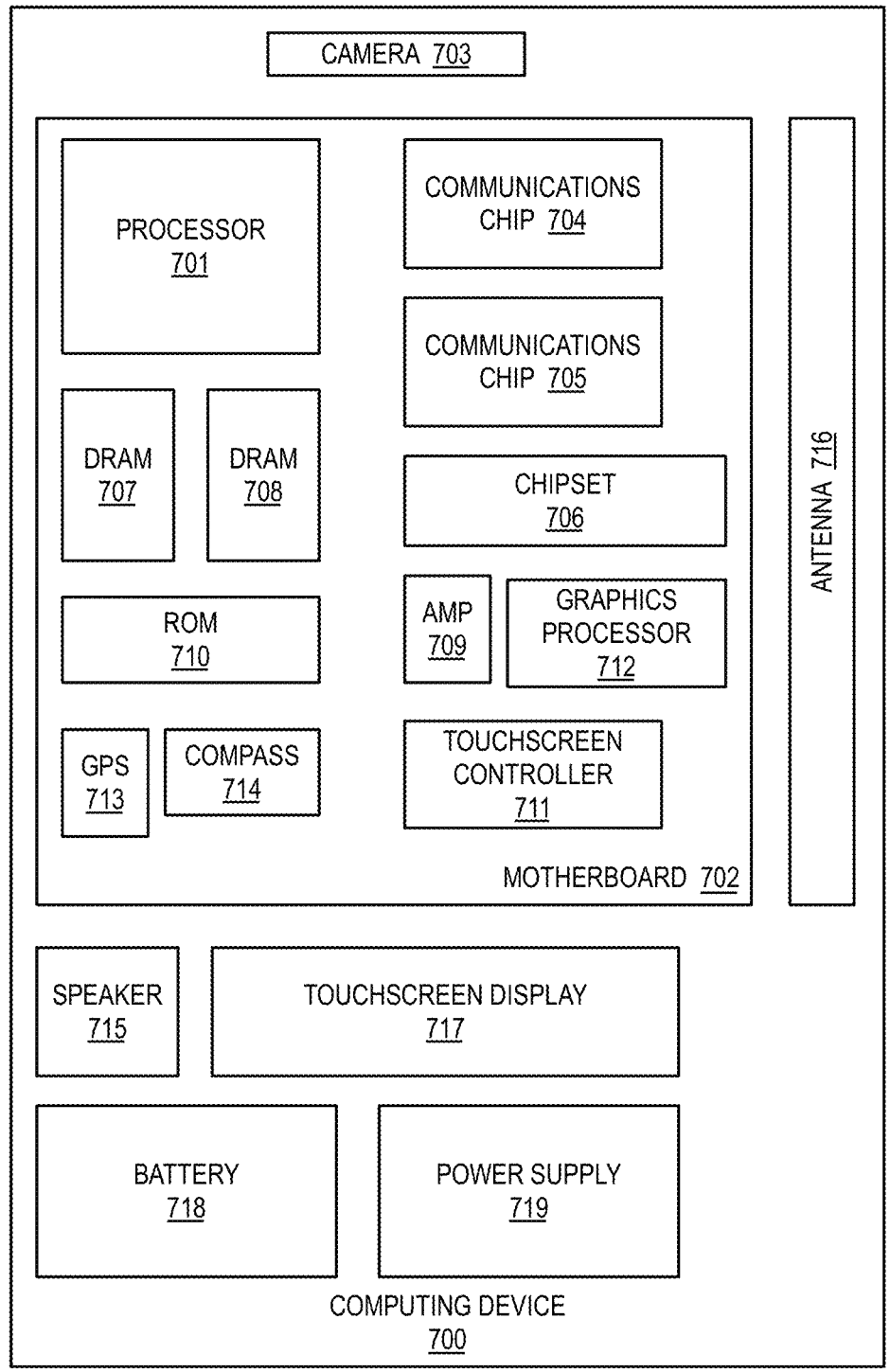
FIG. 7 is a functional block diagram of a computing device, all arranged in accordance with at least some implementations of the present disclosure.

FIG. 7 is a functional block diagram of a computing device 700, arranged in accordance with at least some implementations of the present disclosure. Computing device 700 may be found inside platform 600, for example, and further includes a motherboard 702 hosting a number of components, such as but not limited to a processor 701 (e.g., an applications processor) and one or more communications chips 704, 705. Processor 701 may be physically and/or electrically coupled to motherboard 702. In some examples, processor 701 includes an integrated circuit die packaged within the processor 701. In general, the term "processor" may refer to any device or portion of a device that processes electronic data from registers and/or memory to transform that electronic data into other electronic data that may be stored in registers and/or memory. Any one or more device or component of computing device 700 may include a die or device having any transistor structures and/or related characteristics discussed herein as discussed herein.

In various examples, one or more communication chips 704, 705 may also be physically and/or electrically coupled to the motherboard 702. In further implementations, communication chips 704 may be part of processor 701. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics processor 712, flash memory, global positioning system (GPS) device 713, compass 714, a chipset 706, an antenna 716, a power amplifier 709, a touchscreen controller 711, a touchscreen display 717, a speaker 715, a camera 703, a battery 718, and a power supply 719, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 704, 705 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 704, 705 may implement any of a number of wireless standards or protocols, including but not limited to those described elsewhere herein. As discussed, computing device 700 may include a plurality of communication chips 704, 705. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 719 may convert a source power from a source voltage to one or more voltages employed by other devices of mobile computing platform 600. In some embodiments, power supply 719 converts an AC power to DC power. In some embodiments, power supply 719 converts an DC power to DC power at one or more different (lower) voltages. In some embodiments, multiple power supplies are staged to convert from AC to DC and then from DC at a higher voltage to DC at a lower voltage as specified by components of computing device 700.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

In one or more first embodiments, a transistor structure having a front-side and a back-side comprises a channel semiconductor between a source semiconductor and a drain semiconductor, metallization in contact with a top surface and a first side surface of one of the source semiconductor or the drain semiconductor and in contact with a back-side metal interconnect over the back-side of the transistor structure such that the top surface is proximal to the front-side of the transistor structure, a conformal liner material on a second side surface, opposite the first side surface, of the source or drain semiconductor, and a dielectric material immediately adjacent the conformal liner material.

In one or more second embodiments, further to the first embodiment, the conformal liner material is on a third side surface of the metallization opposite the first side surface of the source semiconductor or the drain semiconductor.

In one or more third embodiments, further to the first or second embodiments, the source semiconductor or the drain semiconductor in contact with the metallization comprises silicon and germanium and the conformal liner material comprises silicon and nitrogen.

In one or more fourth embodiments, further to any of the first through third embodiments, the metallization extends over the conformal liner material on the second side surface and over a portion of the dielectric material immediately adjacent the conformal liner material.

In one or more fifth embodiments, further to any of the first through fourth embodiments, the metallization is a continuous metallization material absent a grain boundary therein.

In one or more sixth embodiments, further to any of the first through fifth embodiments, the metallization is in contact with a first region of the source semiconductor or the drain semiconductor, the first region comprising a recess in the source semiconductor or the drain semiconductor.

In one or more seventh embodiments, further to any of the first through sixth embodiments, the metallization is in contact with the source semiconductor, the transistor structure further comprises a second metallization in contact with the drain semiconductor, the metallization and second metallization both comprise a first composition, and the second metallization is in contact with a front-side metal layer of the transistor structure and absent a contact with a back-side metal layer comprising the back-side metal interconnect.

In one or more eighth embodiments, further to any of the first through seventh embodiments, the transistor structure further comprises a dielectric material between a top surface of the metallization and a front-side metallization layer of the transistor structure.

In one or more ninth embodiments, further to any of the first through eighth embodiments, the conformal liner material is on a portion of the drain semiconductor.

In one or more tenth embodiments, further to any of the first through ninth embodiments, the channel semiconductor comprises a first nanoribbon of a plurality of nanoribbons of the transistor structure.

In one or more eleventh embodiments, a system comprises a power supply and an integrated circuit die coupled to the power supply, the integrated circuit die comprising a transistor structure according to any of the first through eleventh embodiments.

In one or more twelfth embodiments, a method of fabricating an integrated circuit comprises receiving a transistor structure comprising a channel semiconductor between a source semiconductor and a drain semiconductor such that the source or drain semiconductor are exposed, patterning a material plug in contact with a top surface and a first side surface of one of the source semiconductor or the drain semiconductor, depositing a conformal liner material on exposed portions of the source semiconductor or the drain semiconductor and the material plug, the exposed portions including a second side surface of the source semiconductor or the drain semiconductor opposite the first surface, forming a dielectric material adjacent the conformal liner material on the second side surface, removing the material plug to form a deep via extending from over the top surface to below a bottom surface of the source semiconductor or the drain semiconductor, and filling the deep via with a contact metal.

In one or more thirteenth embodiments, further to the twelfth embodiment, the source semiconductor or the drain semiconductor in contact with the material plug comprises silicon and germanium and the conformal liner material comprises silicon and nitrogen.

In one or more fourteenth embodiments, further to the twelfth or thirteenth embodiments, the dielectric material comprises a flowable oxide material.

In one or more fifteenth embodiments, further to any of the twelfth through fourteenth embodiments, the method further comprises, prior to said removing the material plug, patterning the dielectric material adjacent the conformal liner material to form a trench over a portion of the top surface and extending over the dielectric material, such that said filling the deep via further comprises filling the trench with the contact metal.

In one or more sixteenth embodiments, further to any of the twelfth through fifteenth embodiments, the material plug is in contact with the source semiconductor, said patterning the dielectric material further forms a second trench to expose a second top portion of the drain semiconductor, and wherein said filling the deep via further comprises filling the second trench with the contact metal.

In one or more seventeenth embodiments, further to any of the twelfth through sixteenth embodiments, the method further comprises, prior to said filling the deep via, trimming an exposed portion of the source semiconductor or the drain semiconductor.

In one or more eighteenth embodiments, further to any of the twelfth through seventeenth embodiments, the method further comprises exposing a region of the contact metal proximal to the bottom surface of the source semiconductor or the drain semiconductor and contacting the region with a back-side metal.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus, comprising:
a transistor structure having a front-side and a back-side, the transistor structure comprising a channel semiconductor between a source semiconductor and a drain semiconductor;
metallization in contact with a first region of a top surface and a first side surface of one of the source semiconductor or the drain semiconductor and in contact with a back-side metal interconnect over the back-side, wherein the top surface is proximal to the front-side;
a conformal liner material on a second region of the top surface and a second side surface, opposite the first side surface, of the one of the source semiconductor or the drain semiconductor, wherein the conformal liner material has a substantially constant thickness along an entirety of the second side surface extending to a bottom of the one of the source semiconductor or the drain semiconductor, and wherein the metallization is in contact with the conformal liner material over the top surface of the one of the source semiconductor or the drain semiconductor; and
a dielectric material immediately adjacent the conformal liner material.

2. The apparatus of claim 1, wherein the metallization comprises a third side surface on the first side surface of the one of the source semiconductor or the drain semiconductor and a fourth side surface opposite the third side surface, wherein the conformal liner material is on the fourth side surface of the metallization.

3. The apparatus of claim 1, wherein the one of the source semiconductor or the drain semiconductor in contact with the metallization comprises silicon and germanium and the conformal liner material comprises silicon and nitrogen.

4. The apparatus of claim 1, wherein the metallization extends over and on the conformal liner material on a portion of the dielectric material, and wherein the metallization is a continuous metallization material absent a grain boundary therein.

5. The apparatus of claim 1, wherein the first region of the top surface is recessed below the second region of the top surface to form a sidewall at an interface between the metallization and the conformal liner material.

6. The apparatus of claim 1, wherein the metallization is in contact with the source semiconductor, the apparatus further comprises a second metallization in contact with the drain semiconductor, the metallization and second metallization both comprise a same composition, and wherein the second metallization is in contact with a front-side metal layer and absent a contact with a back-side metal layer.

7. The apparatus of claim 6, further comprising a second dielectric material between a top surface of the metallization and the front-side metal layer, wherein the conformal liner material is on a portion of the drain semiconductor.

8. The apparatus of claim 1, wherein the channel semiconductor comprises a first nanoribbon of a plurality of nanoribbons of the transistor structure.

9. The apparatus of claim 1, further comprising:
a power supply; and
an integrated circuit die coupled to the power supply, the integrated circuit die comprising the transistor structure, the metallization, the conformal liner material, and the dielectric material.

10. An apparatus, comprising:
a transistor structure having a front-side and a back-side, the transistor structure comprising a channel semiconductor between a source semiconductor and a drain semiconductor;
metallization in contact with a first region of a top surface of one of the source semiconductor or the drain semiconductor, in contact with a first side surface of the one of the source semiconductor or the drain semiconductor, and in contact with a back-side metal interconnect over the back-side, wherein the top surface is proximal to the front-side;
a conformal liner material, having a substantially constant thickness, in contact with a second region of the top surface of the one of the source semiconductor or the drain semiconductor immediate adjacent the first region, and in contact with a second side surface, opposite the first side surface, of the one of the source semiconductor or the drain semiconductor; and a dielectric material immediately adjacent the conformal liner material.

11. The apparatus of claim 10, wherein the metallization comprises a third side surface on the first side surface of the one of the source semiconductor or the drain semiconductor and a fourth side surface opposite the third side surface, wherein the conformal liner material is on the fourth side surface of the metallization.

12. The apparatus of claim 10, wherein the one of the source semiconductor or the drain semiconductor in contact with the metallization comprises silicon and germanium and the conformal liner material comprises silicon and nitrogen.

13. The apparatus of claim 10, wherein the metallization is in contact with the conformal liner material over the top surface of the one of the source semiconductor or the drain semiconductor.

14. The apparatus of claim 13, wherein the first region of the top surface is recessed below the second region of the top surface to form a sidewall at an interface between the metallization and the conformal liner material.

15. The apparatus of claim 10, wherein the metallization is in contact with the source semiconductor, the apparatus further comprises a second metallization in contact with the drain semiconductor, the metallization and second metallization both comprise a same composition, and wherein the second metallization is in contact with a front-side metal layer and absent a contact with a back-side metal layer.

16. The apparatus of claim 15, further comprising a second dielectric material between a top surface of the metallization and the front-side metal layer.

17. The apparatus of claim 16, wherein the conformal liner material is on a portion of the drain semiconductor.

18. The apparatus of claim 10, wherein the channel semiconductor comprises a first nanoribbon of a plurality of nanoribbons of the transistor structure.

19. The apparatus of claim 10, further comprising:

a power supply; and an integrated circuit die coupled to the power supply, the integrated circuit die comprising the transistor structure, the metallization, the conformal liner material, and the dielectric material.

* * * * *